(12) United States Patent
Shoda et al.

(10) Patent No.: US 8,183,764 B2
(45) Date of Patent: May 22, 2012

(54) ORGANIC ELECTROLUMINESCENCE ELEMENT, MANUFACTURING METHOD FOR AN ORGANIC ELECTROLUMINESCENCE ELEMENT AND DISPLAY UNIT

(75) Inventors: Ryo Shoda, Tokyo (JP); Yuko Abe, Tokyo (JP); Eiichi Kitazume, Tokyo (JP)

(73) Assignee: Toppan Printing Co., Ltd. (JP)

( * ) Notice: Subject to any disclaimer, the term of this patent is extended or adjusted under 35 U.S.C. 154(b) by 180 days.

(21) Appl. No.: 12/406,899

(22) Filed: Mar. 18, 2009

(65) Prior Publication Data

US 2009/0243475 A1    Oct. 1, 2009

(30) Foreign Application Priority Data

Mar. 26, 2008    (JP) .................................. 2008-079895

(51) Int. Cl.
*H01L 51/00*    (2006.01)
(52) U.S. Cl. ........................................ 313/504; 313/506
(58) Field of Classification Search .................. 313/504, 313/506; 257/40, 98
See application file for complete search history.

(56) References Cited

U.S. PATENT DOCUMENTS

| | | | |
|---|---|---|---|
| 6,864,628 B2 * | 3/2005 | Yamazaki et al. | 313/504 |
| 2004/0149984 A1 * | 8/2004 | Tyan et al. | 257/40 |
| 2006/0008740 A1 * | 1/2006 | Kido et al. | 430/296 |
| 2006/0279190 A1 * | 12/2006 | Nakayama | 313/113 |
| 2009/0146553 A1 * | 6/2009 | Abe et al. | 313/504 |

FOREIGN PATENT DOCUMENTS

| | | |
|---|---|---|
| JP | 05-041285 | 2/1993 |
| JP | 11-307259 | 11/1999 |
| JP | 2000-068065 | 3/2000 |
| JP | 2000-215985 | 8/2000 |
| JP | 2000223276 A * | 8/2000 |
| JP | 2002-367784 | 12/2002 |
| JP | 2006-114521 | 4/2006 |
| JP | 2006114759 A * | 4/2006 |
| JP | 2006-155978 | 6/2006 |

\* cited by examiner

*Primary Examiner* — Karabi Guharay
(74) *Attorney, Agent, or Firm* — Squire Sanders (US) LLP

(57) ABSTRACT

One embodiment of the present invention is an organic electroluminescent element including a substrate, a first electrode arranged on said substrate, a luminescent medium layer including at least an organic luminescent layer and a molybdenum oxide layer arranged on the first electrode, a second electrode facing the first electrode, the luminescent medium layer sandwiched between the electrodes and the molybdenum oxide layer including at least molybdic anhydride and one or more other inorganic compounds.

6 Claims, 9 Drawing Sheets

ORGANIC ELECTROLUMINESCENCE ELEMENT, MANUFACTURING METHOD FOR AN ORGANIC ELECTROLUMINESCENCE ELEMENT AND DISPLAY UNIT

CROSS REFERENCE

This application is based upon and claims the benefit of priority from the prior Japanese Patent Application No. 2008-079895, filed on Mar. 26, 2008, the entire content of which is incorporated herein by reference.

BACKGROUND OF THE INVENTION

1. Field of the Invention

The present invention relates to an organic electroluminescence element (EL) using an electroluminescence phenomenon of an organic thin film, and to a process to manufacture an organic electroluminescence element and display unit.

2. Description of the Related Art

An organic electroluminescence element has a structure in which an organic luminescent layer exhibiting at least an electroluminescence phenomenon is sandwiched between an anode electrode and a cathode electrode, and when a voltage is applied between the electrodes, holes and electrons are poured into an organic luminescent layer and by recombining the holes and electrons, the organic luminescent layer becomes a self-luminous element which emits light.

For the purpose of improving luminous efficiency a hole injection layer, a hole transport layer and an electron blocking layer are selected and arranged appropriately between an anode and an organic luminescent layer, and/or a hole blocking layer, an electron transport layer and an electron injection layer, are selected and arranged appropriately between an organic luminescent layer and a cathode. All together an organic luminescent layer, a hole injection layer, a hole transport layer, an electron blocking layer, a hole blocking layer, an electron transport layer, and an electron injection layer or the like, are referred to as a luminescent medium layer.

Each layer of the luminescent medium layer is comprised of an organic material or an inorganic material. An organic material has a low molecular material and a high molecular material.

As examples of using low molecular materials, for example, Copper phthalocyanine (CuPc) is used as a hole injection layer; N,N'-diphenyl-N,N'-bis(3-methylphenyl)-1,1'-biphenyl-4,4'diamine (TPD) is used as a hole transport layer; Tris(8-quinolinol) aluminium (Alq3) is used as an organic luminescent layer; 2-(4-biphenylyl)-5-(4-tert-butyl-phenyl)-1,3,4, oxadiazole (PBD) is used as an electron transport layer; and LiF is used as an electron injection layer.

Generally, each layer of the luminescent medium layer including a low molecular material with a thickness from about 0.1 to 200 nm is deposited mainly by a dry process in a vacuum condition such as a vacuum evaporation method, for example, a resistance heating method or sputtering.

In addition, there are various kinds of low molecular materials and by combining the various materials improvements in luminous efficiency, emission brightness, and life time or the like is expected.

As high molecular materials, for example, the following materials for organic luminescent layers can be used: the material which dissolves low-molecular luminescent coloring matter in polymers such as polystyrene, polymethyl methacrylate and polyvinyl carbazole; macromolecular fluorescent substance such as polyphenylene vinylene derivative (PPV) or poly alkylfluorene derivative (PAF); and polymer phosphor such as rare earth metals.

Generally these high molecular materials dissolve or disperse in a solvent and a film with a thickness from about 1 to 100 nm is formed using a wet process such as coating or printing.

Compared with the use of a dry process in a vacuum condition such as a vacuum evaporation method, the use of a wet process has the following merits: film formation in air is possible, facilities are inexpensive; upsizing is easy; and a film can be formed efficiently in a short time.

In addition, an organic thin film layer using a high molecular material has the following merits: crystallization and cohesion do not occur easily; and because pinholes and foreign matter of the other layers are coated by an organic thin film made of a high molecular material, defects such as short-circuits or dark spots can be prevented.

By contrast, as an inorganic material, alkali metals such as Li, Na, K, Rb, Ce, and Fr, alkaline-earth metals such as Mg, Ca, Sr and Ba, lanthanoid such as La, Ce, Pr, Nd, Sm, Eu, Gd, Db, Dy, Ho, Er, Tm, Yb, Lu, actinoid such as Th, metallic elements such as Sc, Ti, V, Cr, Fe, Co, Ni, Cu, Zn, Y, Ar, Nb, Mo, Ru, Pd, Ag, Cd, Hf, Ta, W, Re, Os, Ir, Pt, Au, Al, Ga, In, Sn, Tl, Pb, and Bi, metalloid elements such as B, Si, Ge, As, Sb, Te, moreover, inorganic compounds such as alloy, oxide, carbide, nitride, boride, sulfide and halide thereof are used for a carrier transport layer.

An inorganic material has better adhesiveness and thermal stability compared with an organic material and improvements in the control of errors in a light emitting phenomenon caused by a leak electrical current, a decrease in the occurrence of non-light emitting areas called dark spots and improvements in emission characteristics and life time of an organic electroluminescence element and display unit are expected. Moreover, because an inorganic material is relatively inexpensive compared with an organic material, when the material is applied to a display unit of large size or large quantity output an inorganic material plays an important role in decreasing costs.

Using the above characteristics, a structure in which an inorganic hole injection layer using an inorganic material is arranged between an organic luminescent layer and an anode which is a hole injecting electrode, is well-known. (Patent Document 1, Patent Document 3, Patent Document 4, Patent Document 5, Cited Document 6, Cited Document 7)

In addition, a structure in which an inorganic electron injection layer using an inorganic material is arranged between an organic luminescent layer and a cathode which is an electron injection electrode is well-known. (Patent Document 2, Patent Document 3, Patent Document 4, Cited Document 7)

Particularly, molybdenum oxide is known as a useful material in which a film is easy to be formed, a hole injecting function from a hole injection electrode is excellent, a stability of transporting holes is high and molybdenum oxide has a good stability and is known as a part of a useful hole transport material and an electron injecting material.

Molybdenum oxide can be divided mainly into molybdic anhydride and molybdenum dioxide. Generally molybdic anhydride is used, because at the time of film formation, transmittance of molybdic anhydride is high and that of molybdenum dioxide is low.

However, since molybdic anhydride is slightly soluble in water, after molybdic anhydride is formed, it becomes easy for solid state properties to change because of a reaction with water. However, molybdenum dioxide and most of the other inorganic compounds are not soluble in water and therefore it is difficult for a change in solid state properties to occur.

In particular, in the case where a luminescent medium layer adjacent to molybdenum oxide is manufactured by a process such as delivery and film formation in which the layer is exposed to air, the film degrades due to degrading factors such as moisture in the air. Therefore, there is a problem of degradation of display characteristics such as luminous efficiency, emission luminance and life time.

That is, in the case where a luminescent medium layer is stacked only by a dry process in a vacuum condition, the effects of degradation factors are few because the number of degradation factors adsorbed on the surface of the molybdic anhydride layer is small. However, in the case where a luminescent medium layer includes a process for forming a film in air, a drastic degradation in display characteristic may be caused.

In addition, in the manufacturing process of forming a film in air such as a wet process, when a solvent of water, alcohol, ketone, carboxylic acid, nitrile and ester is used, molybdic anhydride dissolves in the solvent, the solid state properties and thickness of the film are changed, and in particular, the problem occurs which causes a degradation of luminous efficiency and emission luminance.

Therefore, if molybdenum oxide is used, there was concern that a degradation caused by various degradation factors may occur, and a stable luminescent medium layer could not be formed with every manufacturing process.

The present invention was invented in view of the above circumstances and provides an organic electroluminescent element of high luminous efficiency, high emission brightness and long life time, without defects and protected from the influence of deteriorating factors. In addition, the present invention provides an efficient, inexpensive and stable manufacturing method of an organic electroluminescent element of high luminous efficiency, high emission brightness and long life time, without defects. In addition, the organic electroluminescent element is protected from the influence of deteriorating factors in every process. Furthermore, the present invention provides an inexpensive display of high luminous efficiency, high emission brightness and long life time, without defects and the display is protected from the influence of deteriorating factors.

Patent Document 1: Japanese Patent Laid-Open No.H.11-307259 Official Gazette

Patent Document 2: Japanese Patent Laid-Open No. 2002-367784 Official Gazette

Patent Document 3: Japanese Patent Laid-Open No. H.05-41285 Official Gazette

Patent Document 4: Japanese Patent Laid-Open No. 2000-68065 Official Gazette

Patent Document 5: Japanese Patent Laid-Open No. 2000-215985 Official Gazette

Patent Document 6: Japanese Patent Laid-Open No. 2006-114521 Official Gazette

Patent Document 7: Japanese Patent Laid-Open No. 2006-155978 Official Gazette

SUMMARY OF THE INVENTION

One embodiment of the present invention is an organic electroluminescent element including a substrate, a first electrode arranged on the substrate, a luminescent medium layer including at least an organic luminescent layer and molybdenum oxide layer arranged on the first electrode, a second electrode facing the first electrode, the luminescent medium layer being sandwiched between the electrodes and said molybdenum oxide layer including at least molybdic anhydride and one or more other inorganic compounds.

Figure 1:
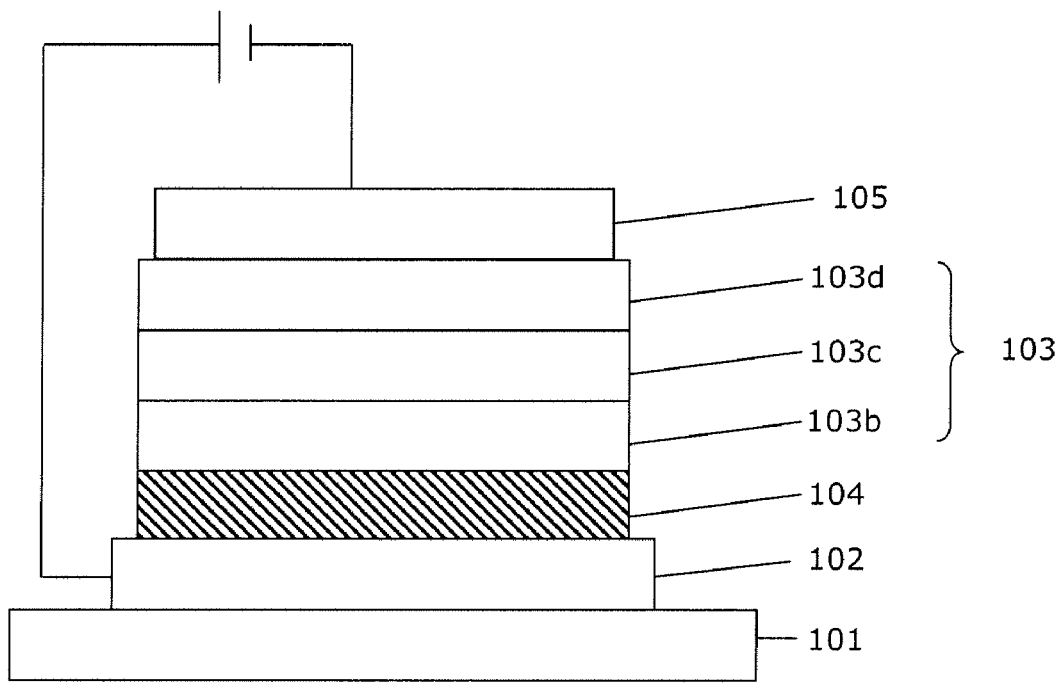
FIG. 1 is an explanatory diagram showing an example of an organic electroluminescence element of the present invention.

101, 301: substrate
102, 302: first electrode
103, 303: luminescent medium layer
103*a*, 303*a*: hole injection layer
103*b*, 303*b*: electron blocking layer
103*c*, 303*c*: organic luminescent layer
103*d*, 303*d*: electron injection layer
104, 304: molybdenum oxide layer (a layer including molybdenum oxide) 104*a*, 104*a'*, 304*a*, 304*a'*: molybdic anhydride layer (a layer including molybdic anhydride)
104*b*, 104*b'*, 104*c*, 104*c'*: one or more other inorganic compounds layer (a layer including one or more other inorganic compounds)
105, 305: second electrode
306: insulating layer
201: substrate to be printed
202: ink tank
203: ink chamber
204: anilox roll
204*a*: ink layer
205: plate
206: plate cylinder
207: flat-bed printing machine

DETAILED DESCRIPTION OF THE INVENTION

The embodiments of the present invention are explained below using the drawings. Furthermore the drawings referred to in the explanation of the following embodiments are for explaining the structure of this invention. Therefore, the size, thickness and measurements of each part shown are different from actual parts. In addition, the present invention is not limited to the following embodiments.

One example of an organic electroluminescent element of the present invention is shown in FIG. 1. FIG. 1 is an exemplary view of a cross section.

In the case where the substrate (101) side is a display side, a translucent and partially strong substrate material can be used for substrate 101. For example, a glass substrate and plastic film or sheet can be used. And if a thin glass substrate from 0.2 to 1.0 mm is used, a thin organic electroluminescent element with excellent barrier properties can be provided.

An electrically conductive substance with which a transparent or semitransparent electrode can be formed can be preferably used for the first electrode 102.

In the case where the first electrode 102 is an anode, for example, a composite oxide of indium and tin (abbreviated below to ITO), a composite oxide of indium and zinc (abbreviated below to IZO) and tin oxide, zinc oxide, indium oxide and a composite oxide of zinc and aluminum can be examples of an electrically conductive substance.

ITO can be preferably used because of its low resistance, high resistance to solvents, and high transparency or the like, and an ITO layer can be deposited by deposition or sputtering on the substrate 101.

In addition, after coating a precursor such as indium octylate and acetone indium on the substrate 101, a layer also can be formed by a coating pyrolysis method in which an oxide is formed by thermal-decomposition. Alternatively, metals such as aluminum, gold, and silver can be vapor-deposited semitransparently. Furthermore, an organic semiconductor such as polyaniline can also be used.

If necessary, the first electrode 102 may be patterned by etching or the like. In addition, surface activation may be performed by a UV treatment, plasma treatment, or the like.

The luminescent medium layer 103 includes a plurality of functional layers such as a hole injection layer, a hole transport layer, a hole injection transport layer, an electron blocking layer, an organic luminescent layer, a hole blocking layer, an electron transport layer, an electron injection layer, an electron injection transport layer and an insulating layer.

In order to obtain sufficient luminous efficiency, emission brightness and life time, a structure in which functional layers including at least an organic luminescent layer and one or more other layers are stacked, is preferred.

Then, because the functional layers include a molybdenum oxide layer having at least molybdic anhydride and one or more other inorganic compounds, an organic electroluminescent element and display unit of high luminous efficiency, high emission brightness and long life time without defects can be provided.

A molybdenum oxide classified into molybdic anhydride ($MoO_3$) and molybdenum dioxide ($MoO_2$, including $2<x<3$, the same as herein below) and shown as $MoO_x$ ($x=2\sim3$) has higher adhesiveness and thermal stability compared with an organic material and control of errors in a light emitting phenomenon caused by a leak electrical current can be improved, the occurrence of a non-light emitting area called a dark spot can be reduced and emission characteristics and life time of an organic electroluminescence element and display unit can be improved. Moreover, a molybdenum oxide has an important role in decreasing costs in the case where the material is applied to a display unit of large size or large quantity output, since molybdenum oxide is relatively inexpensive compared with an organic material.

In addition, a molybdenum oxide is known to be a useful material in the following ways; the boiling point of a molybdenum oxide is lower (1155° C.), compared with that of other inorganic materials and therefore film formation becomes easy, and a function that makes holes easy to inject from a hole injection electrode and a function that stably transports holes are superior.

Moreover, although it is generally difficult to improve the flatness of a film formed by a wet process, since the molybdenum oxide layer is generally deposited by a dry process, the level of flatness is high. When flatness is poor, an electric field assembles in the places where the film is thin and parts where light is not emitted occur within pixels and a uniform light emitting surfaced cannot be provided.

Particularly, since the appearance luminosity of a display unit is proportional to the light-emitting area within a pixel of a display unit, if the light-emitting area within a pixel becomes half, the appearance luminosity also becomes half and the display unit appears dark. Then, for example, when a display unit with a normal light-emitting area within a pixel and a display unit with half the normal light-emitting area within a pixel are manufactured, generally an exponential difference occurs in the luminosity half-life time in the case where the display units are illuminated at the same appearance luminosity and the display unit with half the normal light-emitting area within a pixel has an overwhelmingly shorter life time compared with the display unit with a normal light-emitting area within in a pixel.

For example, polyethylene dihydroxy thiophen or the like which is generally used as a high molecular material of a hole injection layer requires various ingenuities to improve flatness of the layer. However, when a molybdenum oxide is deposited by a dry process, it is easy to provide a uniform light-emitting surface, and the obtained product is superior in terms of high luminance, long life time and flatness with high quality.

Then, because a molybdenum oxide layer includes at least molybdic anhydride and one or more other inorganic compounds, a superior hole transport function and a high transparency of molybdic anhydride can be maintained and since degradation caused by degradation factors such as moisture of molybdic anhydride is controlled by one or more inorganic compounds, an organic electroluminescent element and display unit of high luminous efficiency, high emission brightness and long life time without defects can be provided quickly, efficiently, inexpensively and stably. One or more other inorganic compounds can be arbitrarily selected from alkali metal elements such as Li, Na, K, Rb, Ce, and Fr, alkaline-earth metals such as Mg, Ca, Sr and Ba, lanthanoid such as La, Ce, Pr, Nd, Sm, Eu, Gd, Db, Dy, Ho, Er, Tm, Yb, Lu, metallic elements such as Sc, Ti, V, Cr, Fe, Co, Ni, Cu, Zn, Y, Ar, Nb, Mo, Ru, Pd, Ag, Cd, Hf, Ta, W, Re, Os, Ir, Pt, Au, Al, Ga, In, Sn, Tl, Pb, and Bi and alloy, oxide, carbide, nitride, boride, sulfide and halide thereof.

Among all of the above, oxide, carbide and alloy are preferable because of high stability, high visible light transmission and concise film formation. Moreover, thin layers such as aluminum oxide ($Al_2O_3$), oxide silicon ($SiO_2$), oxidized scandium ($Sc_2O_3$), titanic oxide (TiO, $Ti_2O_3$, $TiO_2$, TiOx ($x=1\sim2$)), vanadium oxide ($V_2O_3$, $V_2O_4$, $V_2O_5$, VOx ($1.5\sim2$)), chrome oxide ($Cr_2O_3$, $CrO_3$), manganese oxide (MnO, $MnO_2$, $Mn_2O_3$, $Mn_3O_4$), ferric oxide (FeO, $Fe_2O_3$, $Fe_3O_4$), cobalt oxide (CoC, $CO_3O_4$), nickel oxide (NiO), copper oxide ($Cu_2O$, CuO), zinc oxide (ZnO), gallium oxide ($Ga_2O_3$), germanium dioxide ($GeO_2$), arsenic oxide ($As_2O_3$), yttrium oxide ($Y_2O_3$), zirconium oxide ($ZrO_2$), niobium oxide (NbO, $Nb_2O_3$, $NbO_2$), niobium pentoxide ($Nb_2O_5$), molybdenum dioxide ($MoO_2$, MoOx ($2<x<3$)), ruthenium oxide ($RuO_2$), palladium oxide (PdO), silver oxide($Ag_2O$), argentine peroxide($Ag_2O_2$), cadmium oxide(CdO), indium oxide(InO, $In_2O$, $In_2O_3$), tin oxide (SnO, $SnO_2$), antimony oxide ($Sb_2O_3$, $Sb_2O_4$, $Sb_2O_5$), tellurium oxide (TeO, $TeO_2$, $TeO_3$), hafnium oxide ($HfO_2$), tantalum oxide (TaO, $Ta_2O_5$, $TaO_2$), tungsten oxide ($WO_2$, $WO_3$), rhenium oxide ($ReO_2$, $Re_2O_7$, $ReO_3$), osmium oxide ($OsO_4$, $Os_2O_4$), iridium oxide ($IrO_2$, $Ir_2O_3$), thallium oxide ($Tl_2O$, $Tl_2O_3$), lead oxide (PbO, $Pb_3O_4$, $Pb_2O_3$, $PbO_2$, PbOx ($1<x<2$)), bismuth oxide ($Bi_2O_3$), ceric oxide ($CeO_2$, $Ce_2O_3$), praseodymium oxide ($Pr_2O_3$, $Pr_6O11$, $PrO_2$, PrOx ($1<x<2$)), neodymium oxide ($Nd_2O_3$), samarium oxide ($Sm_2O_3$), europium oxide (EuO, $Eu_2O_3$), gadolinium oxide ($Gd_2O_3$), terbium oxide ($Tb_2O_3$, $Tb_4O_7$, TbO, TbOx ($x=1.5\sim2$)), dysprosium oxide ($Dy_2O_3$), holmium oxide ($Ho_2O_3$), erbium oxide ($Er_2O_3$), thulium oxide ($Tm_2O_3$), ytterbium oxide($Yb_2O_3$), lutetium oxide ($Lu_2O_3$), thorium oxide($ThO_2$), gallium nitride(GaN), gallium indium nitride (GaInN), zinc selenium (ZnSe), magnesium silver (MgAg) are preferable since all of the above are not easily degraded by degradation factors such as moisture in the air.

When a molybdenum oxide layer is used for a hole transport layer, an inorganic compound having hole transport characteristics with a work function from 4.0 to 6.0 eV is preferable. And when a molybdenum oxide layer is used for an electronic transport layer, an inorganic compound having electronic transport characteristics with a work function from 1.0 to 4.0 eV is preferable.

Therefore, molybdenum dioxide ($MoO_2$, MoOx ($2<x<3$)), indium oxide (InO, $In_2O$, $In_2O_3$), titanic oxide (TiO, $Ti_2O_3$, $TiO_2$, TiOx ($1<x<2$)), iridium oxide ($IrO_2$, $Ir_2O_3$), tantalum oxide (TaO, $Ta_2O_5$, $TaO_2$), nickel oxide (NiO), tungsten oxide ($WO_2$, $WO_3$), vanadium oxide ($V_2O_3$, $V_2O_4$, $V_2O_5$, VOx ($1.5\sim2$)), tin oxide (SnO, $SnO_2$), lead oxide (PbO, $Pb_3O_4$, $Pb_2O_3$, $PbO_2$, PbOx ($1<x<2$)), niobium oxide (NbO, $Nb_2O_3$, $NbO_2$), aluminum oxide ($Al_2O_3$), copper oxide ($Cu_2O$, CuO), manganese oxide (MnO, $MnO_2$, $Mn_2O_3$, $Mn_3O_4$), praseodymium oxide ($Pr_2O_3$, $Pr_6O_{11}$, $PrO_2$, PrOx ($1<x<2$)), chrome oxide ($Cr_2O_3$, $CrO_3$), bismuth oxide ($Bi_2O_3$), calcium oxide (CaO), barium oxide (BaO), cesium oxide ($Cs_2O$), lithium fluoride (LiF), sodium fluoride (NaF), zinc selenide (SeZn), zinc telluride (TeZn), gallium nitride (GaN), gallium indium nitride (GaInN), magnesium silver (MgAg), aluminum lithium (AlLi), copper lithium (CuLi), are more preferable.

As a film forming method of an inorganic compound, there are methods including evaporation in a vacuum condition using resistance heating or electron beam (EB), and a method including sputtering using reactive gas such as Ar gas, $O_2$ gas and $N_2$ gas and CVD or the like.

In particular, when molybdenum dioxide is deposited by sputtering, it is possible to deposit molybdenum dioxide by controlling the sputtering parameters with a reactive sputtering using metallic molybdenum target or molybdenum oxide target and $O_2$ gas and since the same target as molybdic anhydride can be used, it is possible to manufacture an organic electroluminescence element and display unit with concise and quick processes.

Furthermore, the process is concise and superior since a molybdenum dioxide film can be formed by Ar etching a film surface of molybdic anhydride At this point, the ionization potential of molybdic anhydride is from 5.7 eV to 6.0 eV, and the ionization potential of molybdenum dioxide is from 5.3 eV to 5.5 eV.

With regards to the ionization potential of a molybdenum oxide layer it is preferable to select the inorganic material or content rate of the inorganic material while considering the ionization potential of a layer adjacent to the molybdenum oxide layer or carrier balance of holes and electrons from other luminescent medium layers.

For example, as in FIG. 1, when molybdenum oxide layer 104 is arranged on an anode 102, the ionization potential is preferably from 4.0 eV to 6.0 eV and further from 5.5 eV to 5.7 eV in order to optimize a hole injection balance from an anode. For example, it is possible to realize by making the ratio of molybdenum dioxide to molybdic anhydride from 20% to 60%.

Moreover, to control ionization potential and electrical conductivity, other organic materials or inorganic materials may be arbitrarily included in a molybdenum oxide layer. In particular, when a molybdenum oxide layer is used between an organic luminescent layer and a cathode, including alkali metals and alkali earth metals such as lithium fluoride and lithium oxide and/or salt or an oxidative product is more preferable since an electron injection balance is optimized.

In FIG. 1, although a luminescent medium layer 103 is comprised of a molybdenum oxide layer 104, an electron blocking layer 103b, an organic luminescent layer 103c and an electron injection layer 103d on an anode 102, the structure of the luminescent medium layer can be arbitrarily selected.

Moreover in FIG. 1, while a molybdenum oxide layer 104 is arranged as a hole injection layer, it can also be arranged as an arbitrary layer. Furthermore, a plurality of molybdenum oxide layers can be used as different function layers.

Figure 2:
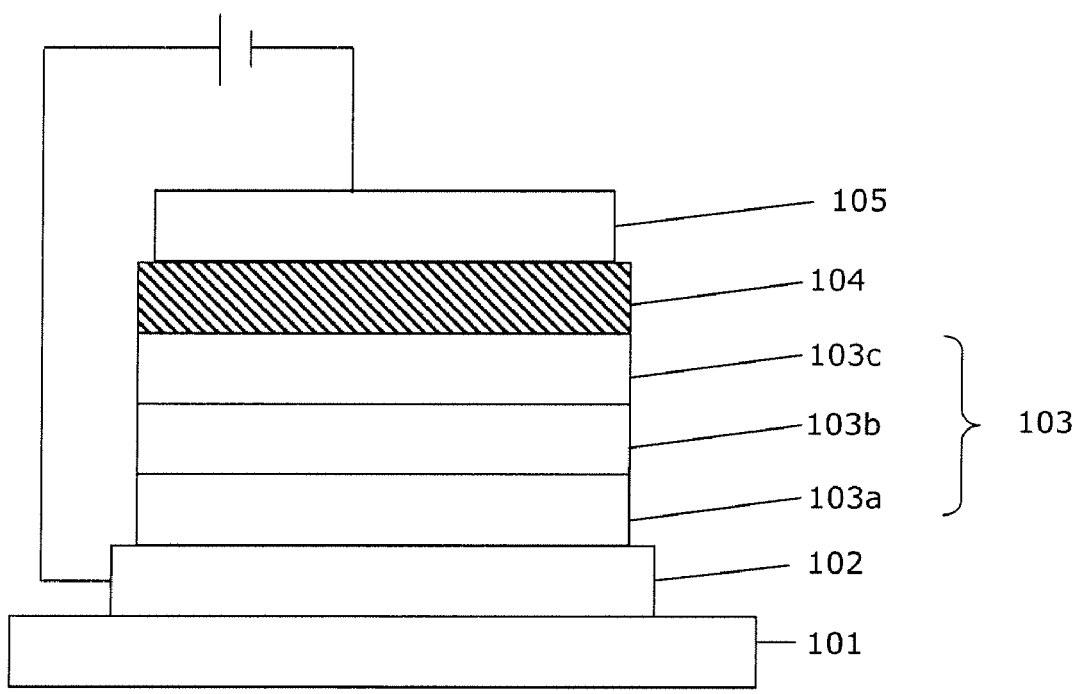
FIG. 2 is an explanatory diagram showing an example of an organic electroluminescence element of the present invention.
Figure 3:
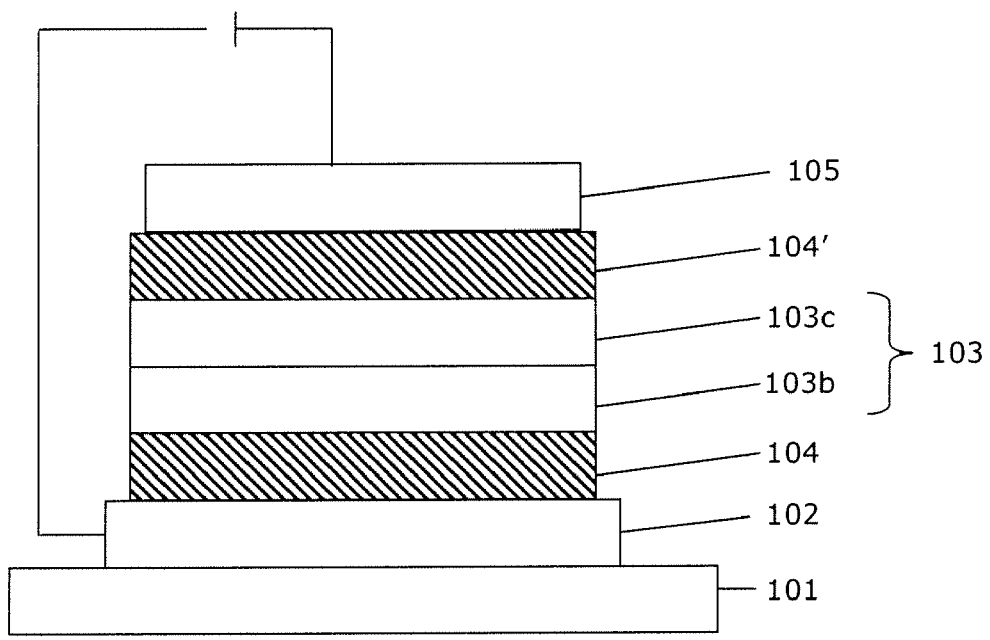
FIG. 3 is an explanatory diagram showing an example of an organic electroluminescence element of the present invention.

FIG. 2 shows an example of a molybdenum oxide layer 104 arranged as an electron injection layer and FIG. 3 shows an example of molybdenum oxide layers 104 and 104' arranged as a hole injection layer and an electron injection layer respectively.

In the case where a molybdenum oxide layer is arranged as an electron injection layer, a work function is preferably from 1.0 eV to 4.0 eV. For example, the ratio of lithium fluoride to molybdic anhydride is preferably equal to or more than 40% and equal to or less than 90% to optimize an electron injection balance from a cathode.

Figure 4:
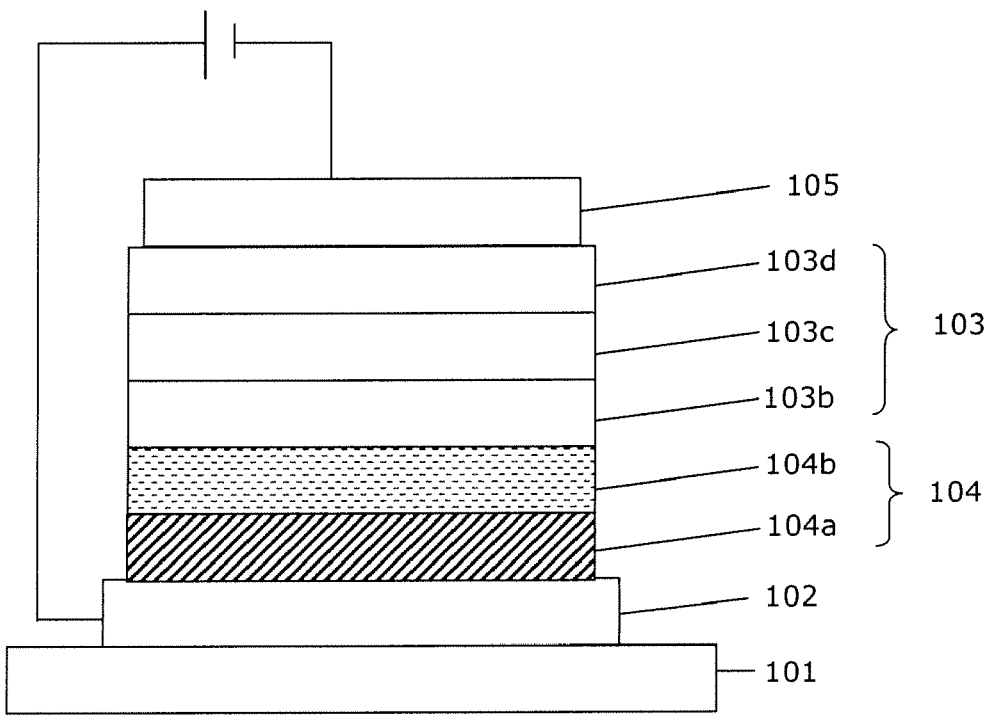
FIG. 4 is an explanatory diagram showing an example of an organic electroluminescence element of the present invention.
Figure 5:
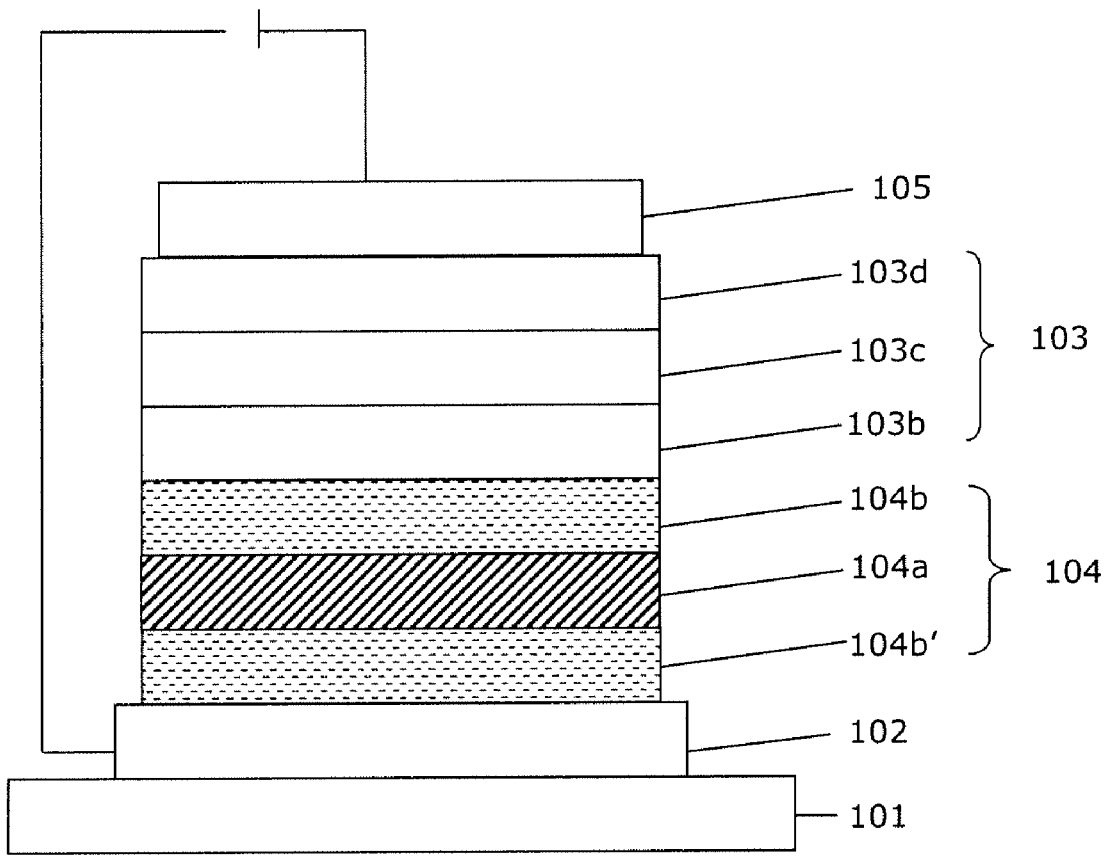
FIG. 5 is an explanatory diagram showing an example of an organic electroluminescence element of the present invention.

FIG. 4 shows an example in which a molybdenum oxide layer 104 comprised of a layer 104a including molybdic anhydride and a layer 104b which includes one or more other inorganic compounds is arranged as a hole injection layer, and in which the layer 104b which includes one or more other inorganic compounds is arranged on an upper layer adjacent to the layer 104a which includes molybdic anhydride. FIG. 5 shows an example in which the molybdenum oxide layer 104 comprised of a layer including molybdic anhydride and a layer including one or more other inorganic compounds is arranged as a hole injection layer and in which the layers 104b and 104b' which include one or more other inorganic compounds are arranged respectively on an upper and lower layer adjacent to the layer 104a which includes molybdic oxide.

Figure 6:
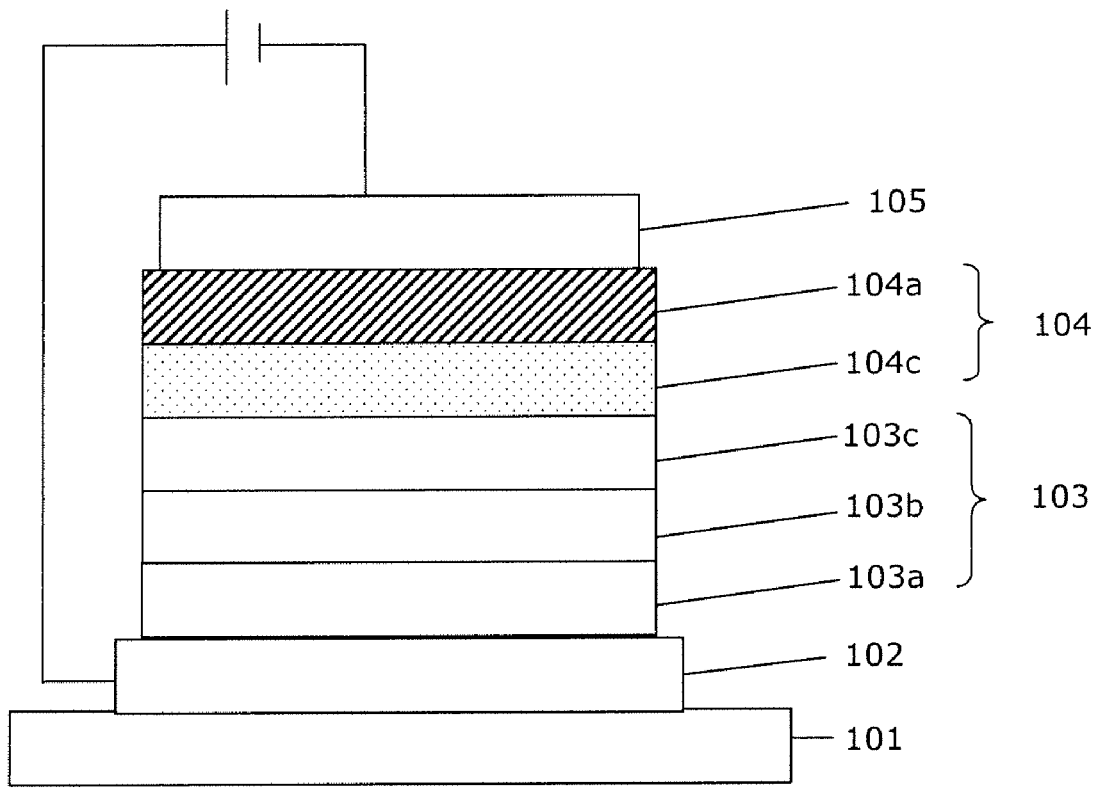
FIG. 6 is an explanatory diagram showing an example of an organic electroluminescence element of the present invention.
Figure 7:
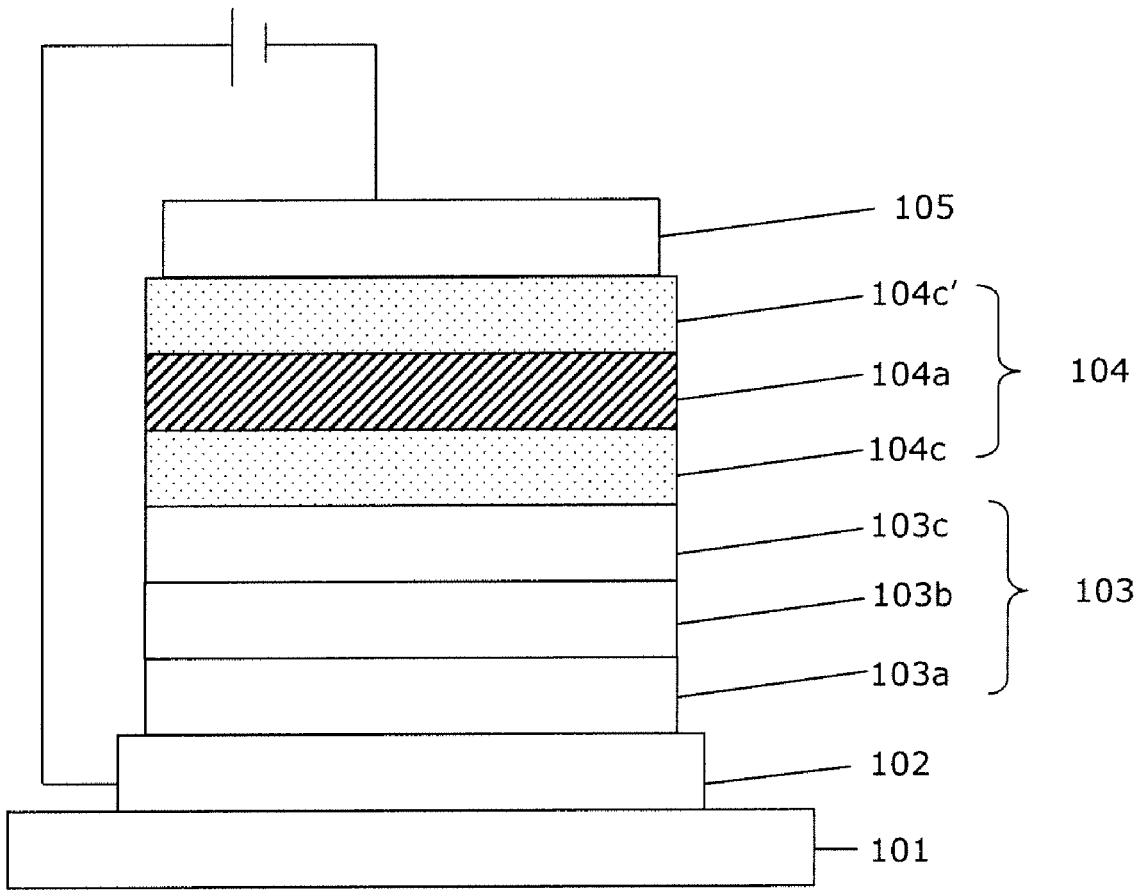
FIG. 7 is an explanatory diagram showing an example of an organic electroluminescence element of the present invention.

FIG. 6 shows an example in which a molybdenum oxide layer 104' comprised of a layer 104a' which includes molybdic anhydride and a layer 104c which includes one or more other inorganic compounds is arranged as an electron injection layer and in which the layer 104c which includes one or more other inorganic compounds is arranged on a lower layer adjacent to the layer 104a' which includes molybdic anhydride. FIG. 7 shows an example in which the molybdenum oxide layer 104' comprised of the layer 104a' which includes molybdic anhydride and the layers 104c and 104c' which include one or more other inorganic compounds is arranged as an electron injection layer and in which the layers 104c and 104c' which include one or more other inorganic compounds are arranged respectively on an upper and lower layer adjacent to the layer 104a' which includes molybdic anhydride.

Figure 8:
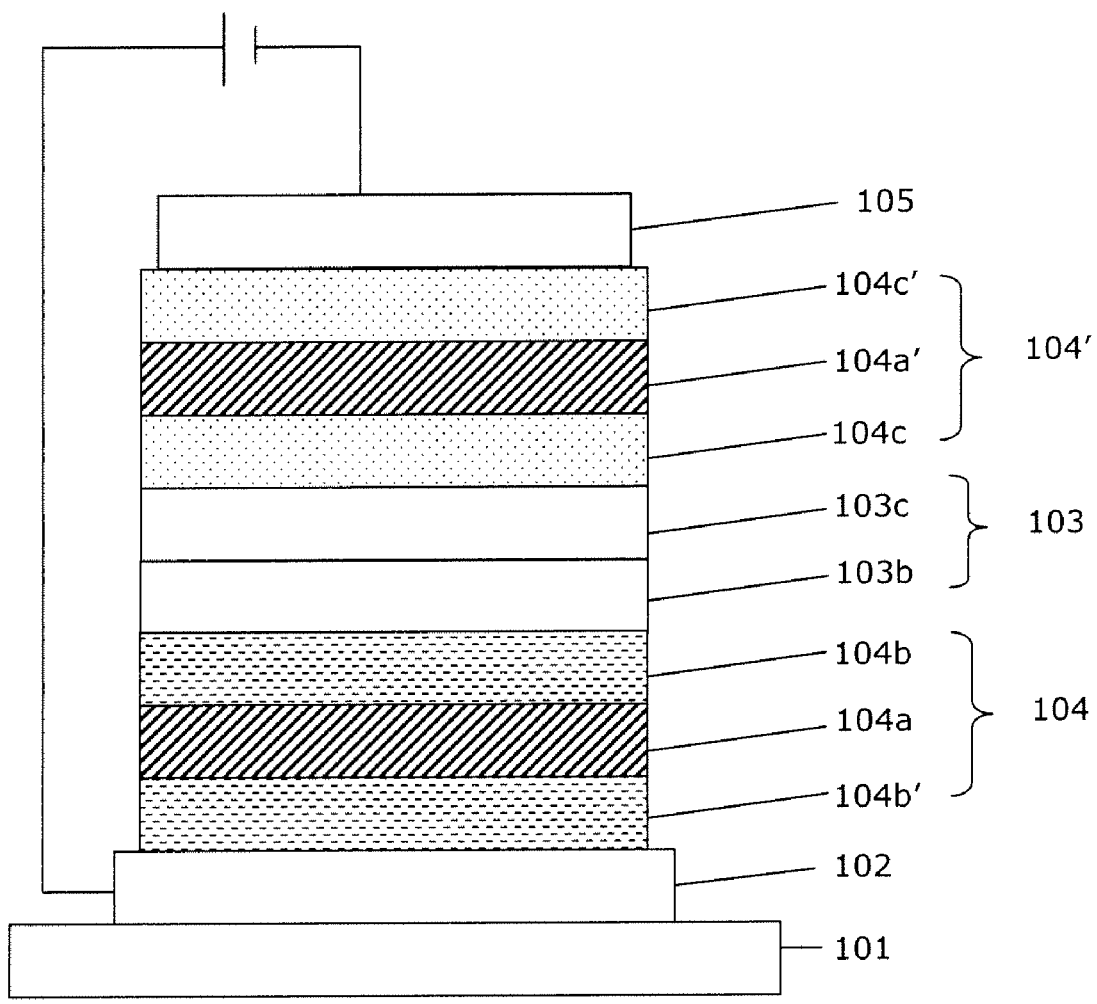
FIG. 8 is an explanatory diagram showing an example of an organic electroluminescence element of the present invention.

FIG. 8 shows an example in which molybdenum oxide layers 104 and 104' which are comprised of layers which include molybdic anhydride, and a layer which includes one or more other inorganic compounds are respectively arranged as a hole injection layer and an electron injection layer, and the former is arranged with the layer 104a which includes molybdic anhydride and the layers 104b and 104b' which include one or more other inorganic compounds respectively arranged on an upper and lower layer adjacent to the layer 104a which includes molybdic anhydride, and the latter is arranged with the layer 104a' which includes molybdic anhydride and the layers 104c and 104c' which include one or more other inorganic compounds respectively arranged on an upper and lower layer adjacent to the layer 104a' which includes molybdic anhydride.

As in FIG. 1, FIG. 2 and FIG. 3, the thickness of molybdenum anhydride layers 104, 104' is arbitrary but are preferably 0.1~200 nm and more preferably 0.1~100 nm to prevent a rise in a drive voltage. When the thickness is too thick, a drop in a power voltage and degradation of efficiency caused by degradation of transmission cannot be ignored. When the thickness is too thin, since the effects of carrier injection and transport become smaller, a drop in a power voltage occurs in each case. In particular, when a material having high insulation properties is used for a molybdenum anhydride layer, excellent injection performance and transmission performance can be provided by forming the thickness from 1~10 nm.

Molybdenum oxide layers 104 and 104' of FIG. 1, FIG. 2 and FIG. 3 can be provided as a compound layer of a molybdic anhydride layer and one or more other inorganic compounds, for example, by depositing at least one or more inorganic compounds and molybdic anhydride simultaneously. As a method for forming a film, there are methods including evaporation in a vacuum condition using resistance heating or electron beam (EB), a method including sputtering using reactive gas such as Ar gas, $O_2$ gas and $N_2$ gas and CVD or the like.

In addition, a molybdenum oxide layer may be arbitrarily combined with an inorganic material or an organic material except an inorganic compound by the same method. In the case where a molybdenum oxide layer is a hole injection layer, an inorganic material and an organic material can be combined appropriately using a vacuum evaporation method such as a resistance heating evaporation, an electron beam method, sputtering and CVD. Lanthanoid such as La, Ce, Pr, Nd, Sm, Eu, Gd, Db, Dy, Ho, Er, Tm, Yb, Lu, actinoid such as Th, metallic elements such as Sc, Ti, V, Cr, Fe, Co, Ni, Cu, Zn, Y, Ar, Nb, Mo, Ru, Pd, Ag, Cd, Hf, Ta, W, Re, Os, Ir, Pt, Au, Al, Ga, In, Sn, Tl, Pb, and Bi metalloid elements such as B, Si, Ge, As, Sb, Te are examples of inorganic materials. And low molecular materials, for example, copper phthalocyanine and its derivative, aromatic amine such as 1,1-bis(4-di-p-tolylamino phenyl)cyclohexane, N,N'-diphenyl-N,N'-bis(3-methylphenyl)-1,1'-biphenyl-4, and 4'diamine (TPD) are examples of organic materials. When a molybdenum oxide layer is an electron injection layer, an inorganic material and an organic material may be combined appropriately using a vacuum evaporation method such as resistance heating evaporation, an electron beam method, sputtering and CVD. Alkali metal elements such as Li, Na, K, Rb, Ce, and Fr, alkaline-earth metals such as Mg, Ca, Sr and Ba, lanthanoid such as La, Ce, Pr, Nd, Sm, Eu, Gd, Db, Dy, Ho, Er, Tm, Yb, Lu, actinoid such as Th, metallic elements such as Sc, Ti, V, Cr, Fe, Co, Ni, Cu, Zn, Y, Ar, Nb, Mo, Ru, Pd, Ag, Cd, Hf, Ta, W, Re, Os, Ir, Pt, Au, Al, Ga, In, Sn, Tl, Pb, and Bi and metalloid elements such as B, Si, Ge, As, Sb, Te are examples of inorganic materials. Triazole-based, oxazole-based, oxadiazole-based, silole-based and boron-based are examples of organic materials.

Molybdic anhydride layers 104a, 104a' of FIGS. 4~8 can be provided by forming at least molybdic anhydride with a method including evaporation in a vacuum condition using resistance heating or electron beam (EB) and a method including sputtering using reactive gas such as Ar gas, $O_2$ gas and $N_2$ gas and CVD or the like.

Moreover, a molybdic anhydride layer may be arbitrarily combined with an inorganic material or an organic material except an inorganic compound by the same method. In the case where a molybdenum oxide layer is a hole injection layer, an inorganic material and an organic material can be combined appropriately using a method including evaporation in a vacuum condition using resistance heating or electron beam (EB) and a method including sputtering using reactive gas such as Ar gas, $O_2$ gas and $N_2$ gas and CVD or the like. Lanthanoid such as La, Ce, Pr, Nd, Sm, Eu, Gd, Db, Dy, Ho, Er, Tm, Yb, Lu, actinoid such as Th, metallic elements such as Sc, Ti, V, Cr, Fe, Co, Ni, Cu, Zn, Y, Ar, Nb, Mo, Ru, Pd, Ag, Cd, Hf, Ta, W, Re, Os, Ir, Pt, Au, Al, Ga, In, Sn, Tl, Pb, and Bi, metalloid elements such as B, Si, Ge, As, Sb, Te are examples of inorganic materials. And low molecular materials, for example, copper phthalocyanine and its derivative, aromatic amine such as 1,1-bis(4-di-p-tolylamino phenyl)cyclohexane, N,N'-diphenyl-N,N'-bis(3-methylphenyl)-1,1'-biphenyl-4,4'diamine (TPD) are examples of organic materials. When a molybdenum oxide layer is an electron injection layer, an inorganic material and an organic material may be combined appropriately using a method including evaporation in a vacuum condition using resistance heating evaporation or electron beam (EB) and a method including sputtering using reactive gas such as Ar gas, $O_2$ gas and $N_2$ gas and CVD or the like. Alkali metal elements such as Li, Na, K, Rb, Ce and Fr, alkaline-earth metals such as Mg, Ca, Sr and Ba, lanthanoid such as La, Ce, Pr, Nd, Sm, Eu, Gd, Db, Dy, Ho, Er, Tm, Yb, Lu, actinoid such as Th, metallic elements such as Sc, Ti, V, Cr, Fe, Co, Ni, Cu, Zn, Y, Ar, Nb, Mo, Ru, Pd, Ag, Cd, Hf, Ta, W, Re, Os, Ir, Pt, Au, Al, Ga, In, Sn, Tl, Pb, and Bi and metalloid elements such as B, Si, Ge, As, Sb, Te are examples of inorganic materials. A Triazole-based, oxazole-based, oxadiazole-based, silole-based and boron-based are examples of organic materials. The layers 104b, 104b', 104c and 104c' which include one or more other inorganic compounds can be provided by a method including evaporation in a vacuum condition using resistance heating or electron beam (EB) and a method including sputtering using reactive gas such as Ar gas, $O_2$ gas and $N_2$ gas and CVD or the like.

Additionally, after the molybdic anhydride layer is formed, a method in which the surface of the molybdic anhydride layer is changed into a molybdenum dioxide layer by etching using Ar gas and $O_2$ gas is also possible.

After a molybdic anhydride layer is formed, it is known that etching by Ar gas and $O_2$ gas causes a composition change and depending on the conditions, x of molybdenum oxide MoOx becomes 2~3 or a mixture compound thereof is formed. (Refer to Journal of Electron Spectroscopy and Related Phenomena, 5 (1974) 351-367) Since the above can be confirmed by a chemical composition analysis such as X-ray photoemission spectroscopy, molybdenum dioxide can be formed if etching is performed under the condition that x becomes 2. Here, etching is a phenomenon in which a sample surface is trimmed by sputtering, i.e. electrically-charging Ar gas and $O_2$ gas by thermal electrons, accelerating the gas by a high voltage and bombarding the sample surface. In particular, in the case of molybdenum oxide, since oxygen atoms can be more easily etched than molybdenum atoms, it is possible that a composition change such as x of MoOx becoming 2~3 occurs at the same time as trimming a surface. Since the above phenomenon also occurs with $Au_2O_3$, $Ag_2O$, $Ag_2O_2$, PdO, CuO, $Cu_2O$, $IrO_2$, PbO, NiO, $PbO_2$, CdO, FeO, $RuO_2$, $WO_2$, $WO_3$, $Fe_2O_3$ and $Fe_2O_3$, after depositing the inorganic compound layer, the composition may be changed in the same way.

The thickness of a molybdic anhydride layer is arbitrary but preferably equal to or more than 5 nm and equal to or less than 100 nm.

The thickness of a layer which includes one or more other inorganic compounds is arbitrary but preferably equal to or more than 0.5 nm and equal to or less than 70 nm. If the thickness is over 70 nm, degradation of characteristics such as a drop in power voltage and degradation of transmission occurs. If the thickness is thinner than 0.5 nm, the effects of these degradation factors cannot be prevented. Moreover, the thickness is preferably equal to or more than 5 nm and equal to or less than 30 nm to balance prevention of a power decrease, degradation of transmission and barrier properties of degradation factors.

When the luminescence spectrum of an organic electroluminescence element is considered, when the wavelength of a visible light area is equal to or more than 380 nm and equal to or less than 800 nm, the transmission rate becomes the object of evaluation. Transmission is influenced by emission brightness. Therefore, brightness half-life is also significantly influenced and is very important. Considering the above, the transmission rate of layers which includes one or more other inorganic compounds is preferably at least equal to or more than 70% in a visible light area.

Figure 11:
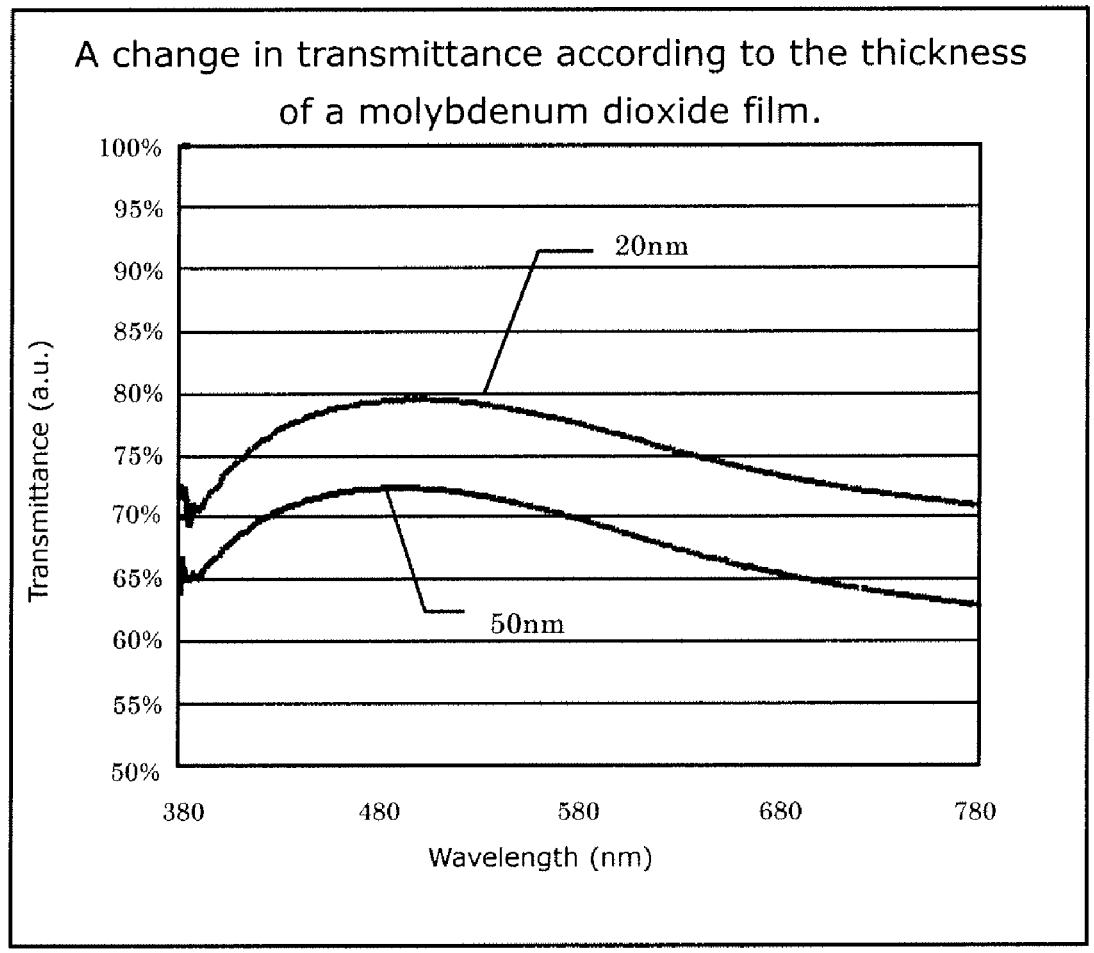
FIG. 11 is a diagram showing a change in transmittance according to the thickness of a molybdenum dioxide film.

FIG. 11 shows the results of measuring the transmission rate of a film of one or more other inorganic compounds formed in a vacuum condition on a glass with a thickness of 20 nm and a sample formed with a thickness of 50 nm using a microspectroscope device (TOSHIBA FA310A). When the film thickness is 20 nm, the transmission rate in a visible light area is equal to or more than about 70%, and when the film thickness is 50 nm, the transmission rate in a visible area is equal to or more than 60%.

Moreover, the transmission rate of the entire molybdenum oxide layer is preferably at least equal to or more than 60% in a visible light wavelength area.

Here, the effects of a high transmission rate of a molybdenum oxide layer are best demonstrated when the molybdenum oxide layer 104 is located closer to the substrate 101 side, where visible light is taken out, than the organic luminance layer 103c as shown in FIG. 1. In other words, for example, in the case where the substrate 101 side is the display side as in the structure in FIG. 2, the transmission rate of the molybdenum oxide layer 104' may be arbitrary.

On the other hand, as a material other than molybdenum oxide which can be used for a hole transport layer, a hole injection layer and a hole injection transport layer, a material which is used as a hole transport material in general can be preferably used. For example, copper phthalocyanine and its derivative, aromatic amine such as 1,1-bis(4-di-p-tolylamino phenyl)cyclohexane, N,N'-diphenyl-N,N'-bis(3-methylphenyl)-1,1'-biphenyl-4,4'diamine (TPD) can be used for low molecular material and a film can be formed by a dry process such as a vacuum evaporation method in a vacuum condition.

Furthermore, the above materials dissolve and disperse in either a single solvent alone or a mixed solvent. Toluene, xylene, acetone, anisole, methyl anisole, dimethyl anisole, ethyl benzoate, methyl benzoate, mesitylene, tetralin, amyl benzene, methyl ethyl ketone, methyl isobutyl ketone, cyclohexanone, methanol, ethanol, isopropyl alcohol, ethyl acetate, butyl acetate and water are examples of a single solvent or a mixed solvent thereof. And after dissolution and dispersion, the above materials are used for a hole injection ink, a hole transport ink and a hole injection transport ink. Therefore, film formation by a wet process in air becomes possible.

Moreover, poly aniline, poly thiophenes, polyvinylcarbazole, a mixed material of poly(3,4-ethylenedioxy thiophene) with polystyrene sulfonic acid, PPV derivative and PAF derivative can be used for a high molecular material. A hole injection material and hole transport material dissolves and disperses in either a single solvent alone such as toluene, xylene, acetone, methyl ethyl ketone, methyl isobutyl ketone, cyclohexanone, methanol, ethanol, isopropyl alcohol, ethyl acetate, butyl acetate and water, or a mixed solvent thereof and is used for hole injection ink, hole transport ink and hole injection transport ink. Then film formation by a wet process in air is possible.

Here, even if a molybdenum oxide layer is adjacent to a hole injection layer, a hole transport layer, a hole injection transport layer which are formed using in particular, water, alcohol, ketone, carboxylic acid, nitrile, ester and aromatic among the above solvents, if a molybdenum oxide layer has the structure of the present invention, solid state properties and thickness of the molybdenum oxide layer do not change and a stable structure can be maintained.

Furthermore, lanthanoid such as La, Ce, Pr, Nd, Sm, Eu, Gd, Db, Dy, Ho, Er, Tm, Yb, Lu, actinoid such as Th, metallic elements such as Sc, Ti, V, Cr, Fe, Co, Ni, Cu, Zn, Y, Ar, Nb, Mo, Ru, Pd, Ag, Cd, Hf, Ta, W, Re, Os, Ir, Pt, Au, Al, Ga, In, Sn, Tl, Pb, and Bi, metalloid elements such as B, Si, Ge, As, Sb, Te, and inorganic compounds such as alloy, oxide, carbide, nitride, boride, sulfide and halide thereof can be formed by a vacuum evaporation method, sputtering and CVD or the like.

OXD-1, PBD, BCP, Alq3, 3-(4-biphenylyl)-5-(4-tert-butylphenyl)-4-phenyl-1,2,4-triazole(TAZ) 4,4'-bis(1,1-diphenylethenyl) biphenyl(DPVBi), 2,5-bis(1-naphthyl)-1.3.4-oxadiazole(BND)4,4'-bis(1,1-bis(4-methyl phenyl)ethenyl) biphenyl(DTVBi), 2,5-bis(4-biphenylyl)-1,3,4-oxadiazole (BBD), oxadiazole high-molecular compound, triazole high-molecular compound can be examples of an electron blocking material used for an electron blocking layer 103b.

As an organic luminescent body used for an organic luminescent layer 103c, an organic luminescent material can be used preferably in general. For example, heretofore known fluorescent low molecular materials capable of emitting light from a singlet state and heretofore known phosphorescent low molecular materials capable of emitting light from a triplet state of rare-earth metal complex such as coumarin, perylene, pyran, anthrone, porphyrin, quinacridone, N,N'-dialkyl substituted quinacridone, naphthalimide, and N,N'-diaryl substituted pyrrolo pyrrole can be used. And a film formed from the above can be deposited by a dry process such as a vacuum evaporation method in vacuum condition.

In addition, the above materials dissolve and disperse in either a single solvent alone such as toluene, xylene, acetone, anisole, methyl anisole, dimethyl anisole, ethyl benzoate, methyl benzoate, mesitylene, tetralin, amyl benzene, methyl ethyl ketone, methyl isobutyl ketone, cyclohexanone, methanol, ethanol, isopropyl alcohol, ethyl acetate, butyl acetate and water, or a mixed solvent thereof and is used for an organic luminescent ink and film formation by a wet process in air is possible.

In addition, for a high molecular material, fluorescence pigments such as coumarin, perylene, pyran, anthrone, porphyrin, quinacridone, N,N'-dialkyl substituted quinacridone, naphthalimide, and N,N'-diaryl substituted pyrrolo pyrrole dissolving in high molecular such as polystyrene, polymethylmethacrylate and polyvinyl carbazole, high molecular fluorescence luminous body such as PPV and PAF and high molecular luminous body such as high molecular phosphorescent luminous body including rare-earth metal complex can be used.

In addition, the above materials dissolve or disperse in either a single solvent alone such as toluene, xylene, acetone, anisole, methyl anisole, dimethyl anisole, ethyl benzoate, methyl benzoate, mesitylene, tetralin, amyl benzene, methyl ethyl ketone, methyl isobutyl ketone, cyclohexanone, methanol, ethanol, isopropyl alcohol, ethyl acetate, butyl acetate and water, or a mixed solvent thereof and is used for an organic luminescent ink and film formation by a wet process in air is possible.

In particular, aromatic solvents such as toluene, xylene, anisole, methyl anisole, dimethyl anisole, ethyl benzoate, methyl benzoate, mesitylene, tetralin and amyl benzene have superior solubility of high molecular material and can be handled easily and therefore are preferable.

Even if a molybdenum oxide layer is adjacent to an organic luminescent layer which is formed by using in particular, water, alcohol, ketone, carboxylic acid, nitrile, ester and aromatic among the above solvents, when a molybdenum oxide layer has the structure of the present invention, solid state properties and the thickness of the molybdenum oxide layer do not change and a stable structure can be maintained.

And as a material except molybdenum oxide which can be used for electron injection layer $103d$, alkali metals such as lithium fluoride and barium oxide, alkaline-earth metal and salt and oxidative product of alkaline-earth metal and alkali metal can be used preferably and a film can be formed by a dry process such as a vacuum evaporation in vacuum condition.

The thickness of each luminescent medium layer is arbitrary but 0.1~200 nm is preferable.

When the second electrode 105 is a cathode, metal simple substances such as Mg, Al and Yb and alloy of low work function metal and stable metal, for example, alloy such as MgAg, AlLi, CuLi can be used, while the alloy is capable of balancing electron injection efficiency with stability As a method of forming a cathode, a vacuum evaporation method, electron beam and a sputtering or the like can be used depending on the material. The thickness of the cathode is preferably about 10 nm~1000 nm.

In FIG. 1, layers are stacked from an electrode as an anode on the substrate 101, however, layers can also be arbitrarily stacked from an electrode as a cathode.

Moreover, in FIG. 1, the substrate 101 side is a display side, however, the opposite side of the substrate 101 can arbitrarily be a display side.

And, in an organic electroluminescence element of the present invention at least one side of a luminescent medium layer adjacent to a molybdenum oxide layer including at least molybdic anhydride and one or more other inorganic compounds can be formed in air.

For example, even if a luminescent medium layer is formed in air adjacent to the upper side of the molybdenum oxide layer 104 in FIG. 1, because the molybdenum oxide layer 104 includes one or more other inorganic compounds, degradation caused by degradation factors of the molybdenum oxide layer 104 originated in the degradation factors such as water in the air, is prevented. The above manufacturing process can manufacture an efficient organic electroluminescence element.

And for example, even if a luminescent medium layer is formed in air adjacent to the lower side of the molybdenum oxide layer 104' in FIG. 2, because the molybdenum oxide layer 104' includes one or more other inorganic compounds, degradation of the molybdenum oxide layer caused by degradation factors such as water in the air which remained in a lower layer is prevented. The above manufacturing process can efficiently manufacture an organic electroluminescence element.

Moreover, for example, even if a luminescent medium layer is formed in air adjacent to the upper side of the molybdenum oxide layer 104 and a luminescent medium layer is formed in air adjacent to the lower side of the molybdenum oxide layer 104' in FIG. 3, degradation of the molybdenum oxide layers 104 and 104' caused by degradation factors such as water in air is prevented. The above manufacturing process can efficiently manufacture an organic electroluminescence element.

And, for example, even if a luminescent medium layer is formed in air adjacent to the upper side of the molybdenum oxide layer 104 in which the layer 104b including one or more other inorganic compounds is formed on an upper side of the molybdic anhydride layer 104a in FIG. 4, degradation of the molybdenum oxide layer 104 caused by degradation factors such as water in air is prevented. The above manufacturing process can efficiently manufacture an organic electroluminescence element.

Moreover, for example, even if a luminescent medium layer is formed adjacent to the upper side of the molybdenum oxide layer 104 in which the layer 104b including one or more other inorganic compounds and the layer 104b' including one or more other inorganic compounds are respectively formed on the upper and lower side of the molybdic anhydride layer 104a in FIG. 5, degradation of the molybdenum oxide layer 104 caused by degradation factors such as water in the air is prevented. The above manufacturing process can efficiently manufacture an organic electroluminescence element. And degradation factors of the substrate 101 and first electrode 102 are also prevented.

And, for example, even if a luminescent medium layer is formed in air adjacent to the lower side of the molybdenum oxide layer 104' in which the molybdic anhydride layer 104a' is formed on the upper side of the layer 104c which includes one or more other inorganic compounds in FIG. 6, degradation of the molybdenum oxide layer 104 caused by degradation factors such as water in the air is prevented. The above manufacturing process can efficiently manufacture an organic electroluminescence element.

Moreover, for example, even if a luminescent medium layer is formed in air adjacent to the lower side of the molybdenum oxide layer 104' in which the layer 104c including one or more other inorganic compounds and the layer 104c' including one or more other inorganic compounds are respectively formed on the upper and lower side of the molybdic anhydride layer 104a' in FIG. 7, degradation of the molybdenum oxide layer 104 caused by degradation factors such as water in the air is prevented. The above manufacturing process can efficiently manufacture an organic electroluminescence element.

And, for example, even if a luminescent medium layer is formed in air adjacent to the upper side of the molybdenum oxide layer 104 in which the layer 104b including one or more other inorganic compounds and the layer 104b' including one or more other inorganic compounds are respectively formed on the upper and lower side of the molybdic anhydride layer 104a, and a luminescent medium layer formed in air adjacent to the lower side of the molybdenum oxide layer 104' in which the layer 104c including one or more other inorganic compounds and the layer 104c' including one or more other inorganic compounds are respectively formed on the lower and upper side of the molybdic anhydride layer 104a' in FIG. 8, degradation of the molybdenum oxide layer 104 and 104' caused by degradation factors such as water in the air is prevented. The above manufacturing process can efficiently manufacture an organic electroluminescence element.

In addition, an organic electroluminescence element of the present invention can form a luminescent medium layer on at least one side which is adjacent to a molybdenum oxide layer having at least molybdic anhydride and one or more other inorganic compounds by a wet process.

For example, even if a luminescent medium layer is formed adjacent to the upper side of the molybdenum oxide layer 104 in FIG. 1 by a wet process, because the molybdenum oxide layer 104 has one or more other inorganic compounds, degradation which originated with degradation factors of the molybdenum oxide layer 104 caused by degradation factors of solvent or the like is prevented. The above manufacturing process can efficiently manufacture an organic electroluminescence element.

And, for example, even if a luminescent medium layer is formed adjacent to the lower side of the molybdenum oxide layer 104' in FIG. 2 by a wet process, because the molybdenum oxide layer 104' has an inorganic compound, degradation of the molybdenum oxide layer 104' caused by degradation factors of a solvent which remained in a lower layer or the like is prevented. The above manufacturing process can efficiently manufacture an organic electroluminescence element.

Moreover, for example, even if a luminescent medium layer is formed adjacent to the upper side of the molybdenum oxide layer 104, and a luminescent medium layer adjacent to the lower side of the molybdenum oxide layer 104' in FIG. 3 by a wet process, degradation of the molybdenum oxide layers 104, 104' caused by degradation factors of a solvent or the like is prevented. The above manufacturing process can efficiently manufacture an organic electroluminescence element.

And, for example, even if a luminescent medium layer is formed adjacent to the upper side of the molybdenum oxide layer 104 in which the layer 104b including one or more other inorganic compounds is formed on the upper side of the molybdic anhydride layer 104a in FIG. 4 by a wet process, degradation of the molybdenum oxide layer 104 caused by degradation factors of a solvent or the like is prevented. The above manufacturing process can efficiently manufacture an organic electroluminescence element.

Moreover, for example, even if a luminescent medium layer is formed adjacent to the upper side of the molybdenum oxide layer 104 in which the layer 104b including one or more other inorganic compounds and the layer 104b' including one or more other inorganic compounds are respectively formed on the upper and lower side of the molybdic anhydride layer 104a in FIG. 5 is by a wet process, degradation of the molybdenum oxide layer 104 caused by degradation factors of a solvent or the like is prevented. The above manufacturing process can efficiently manufacture an organic electroluminescence element. And degradation factors of the substrate 101 and first electrode 102 are also prevented.

And, for example, even if a luminescent medium layer is formed adjacent to the lower side of the molybdenum oxide layer 104' in which the molybdic anhydride layer 104a is formed on the upper side of the layer 104c including one or more other inorganic compounds in FIG. 6 by a wet process, degradation of the molybdenum oxide layer 104 caused by degradation factors of a solvent or the like is prevented. The above manufacturing process can efficiently manufacture an organic electroluminescence element.

Moreover, for example, even if a luminescent medium layer is formed adjacent to the lower side of the molybdenum oxide layer 104' in which the layer 104c including one or more other inorganic compounds and the layer 104c including one or more other inorganic compounds' are respectively formed on the lower and upper side of the molybdic anhydride layer 104a' in FIG. 7 by a wet process, degradation of the molybdenum oxide layer 104 caused by degradation factors of a solvent or the like is prevented. The above manufacturing process efficiently can manufacture an organic electroluminescence element.

And, for example, even if a luminescent medium layer is formed adjacent to the upper side of the molybdenum oxide layer 104 in which the layer 104b including one or more other inorganic compounds and the layer 104b' including one or more other inorganic compounds are respectively formed on the upper and lower side of the molybdic anhydride layer 104a and even if a luminescent medium layer is formed adjacent to the lower side of the molybdenum oxide layer 104' in which the layer 104c including one or more other inorganic compounds and the layer 104c' including one or more other inorganic compounds are respectively formed on the upper and lower side of the molybdic anhydride layer 104a' in FIG. 8 by a wet process, degradation of the molybdenum oxide layers 104 and 104' caused by degradation factors of a solvent or the like is prevented. The above manufacturing process can efficiently manufacture an organic electroluminescence element.

A wet process includes a coating method and printing method or the like. A spin coater, a bar coating machine, a roll coater and an engraved-roll coater or the like can be preferably used for the coating method.

Furthermore, a printing method capable of forming a pattern directly with ease can be preferably used.

From here onwards, when a luminescent medium layer is formed by a wet process, heretofore known printing methods such as a letterpress printing method, an intaglio printing method, a screen printing method, a gravure printing method, a flexography method and an offset lithography method can be preferably used.

In particular, a letterpress printing method is suitable for manufacture of an organic electroluminescence element, since a letterpress printing method can print with an excellent viscosity range of viscosity properties of ink without damaging a substrate material and thus use efficiency of the ink material is superior.

Figure 9:
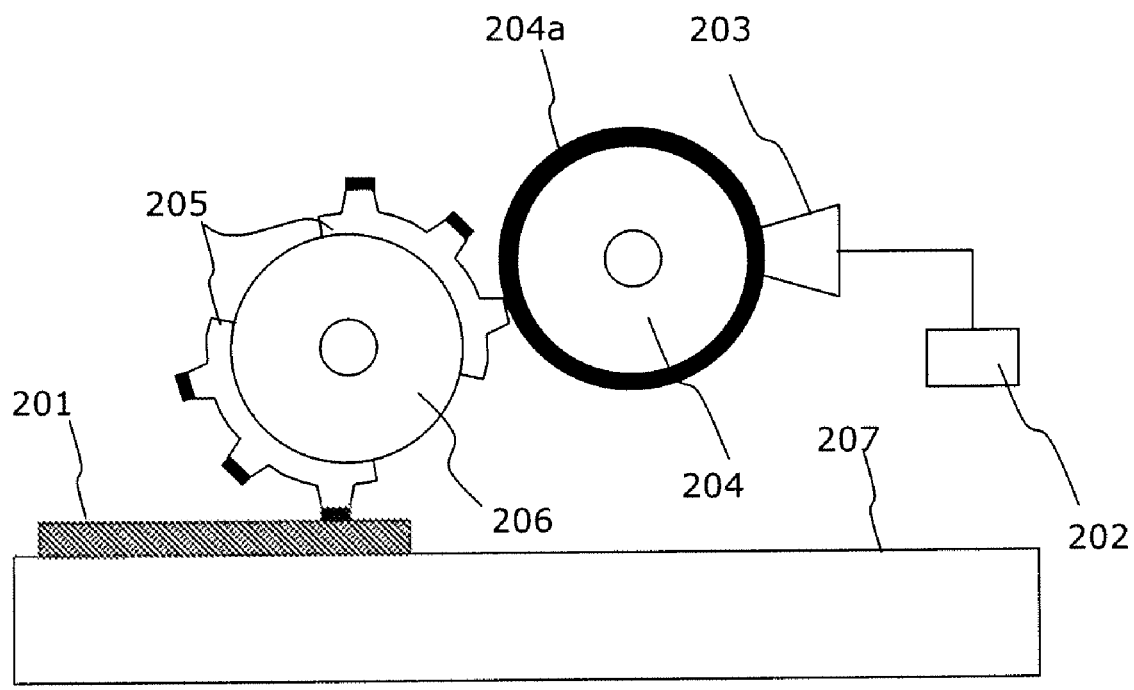
FIG. 9 is an explanatory diagram showing an example of a letterpress printing method used in the present invention.

FIG. 9 shows one example of a letterpress printing method of the present invention. FIG. 9 indicates an outline of a letterpress printing method when an ink including material of a luminescent medium layer is pattern printed on a substrate 201 to be printed on which an electrode or the like is formed.

The letterpress printing method has an ink tank 202, an ink chamber 203, an anilox roll 204 and a plate cylinder 206 on which a relief printing plate 205 is equipped. An ink including material of a luminescent medium layer is taken to the ink tank 202. An ink can be sent into the ink chamber 203 from the ink tank 202. And the anilox roll 204 makes contact with an ink feed section of the ink chamber 203, and it is rotatably supported.

According to the rotation of the anilox roll 204, ink layer 204a having ink supplied on the surface of the anilox roll becomes uniform. This ink layer is transferred to projection parts of the plate 205 which is mounted on a printing cylinder 206 which is rotationally driven in proximity to the anilox roll 204.

The substrate to be printed 201 is transported to a printing position corresponding to a projection of the plate 205 on a flat-bed printing machine 207 by a transporting means not shown in the diagram. And ink on projection parts of the plate 205 is printed on the substrate to be printed 201. Then, ink is dried if necessary and an organic luminescent layer is preferably formed on the substrate to be printed 201 in this way.

A well-known plate can be preferably used for plate 205. However, a light-sensitive resin relief printing plate is especially preferable. A light-sensitive resin relief printing plate has a solvent developing type (developer for an exposed resin is an organic solvent.) and a water-developable type (developer is water.). A solvent developing type has resistance to a water type ink. A water-developable type has resistance to an organic solvent ink. Depending on the characteristic of an ink comprising a material of the luminescent medium layer, the relief printing plate can be selected from a solvent developing type and a water developing type.

The organic electroluminescence element shown in FIG. 1 can be manufactured for example, by the following method: After the molybdenum oxide layer 104 is formed as a hole injection layer in a vacuum condition an electron blocking layer 103b and organic luminescent layer 103c are formed by letterpress printing in air and the electron injection layer 103d is formed in a vacuum condition.

Moreover, the organic electroluminescence element shown in FIG. 2 can also be manufactured for example, by the following method: After the electron injection layer 103a and electron blocking layer 103b are formed in a vacuum condition an organic luminescent layer 103c is formed by letterpress printing in air and the molybdenum oxide layer 104' is formed as an electron injection layer in a vacuum condition. As the above method, formation of a luminescent medium layer in a vacuum condition and formation of a luminescent medium layer in air can be preferably combined.

Figure 10:
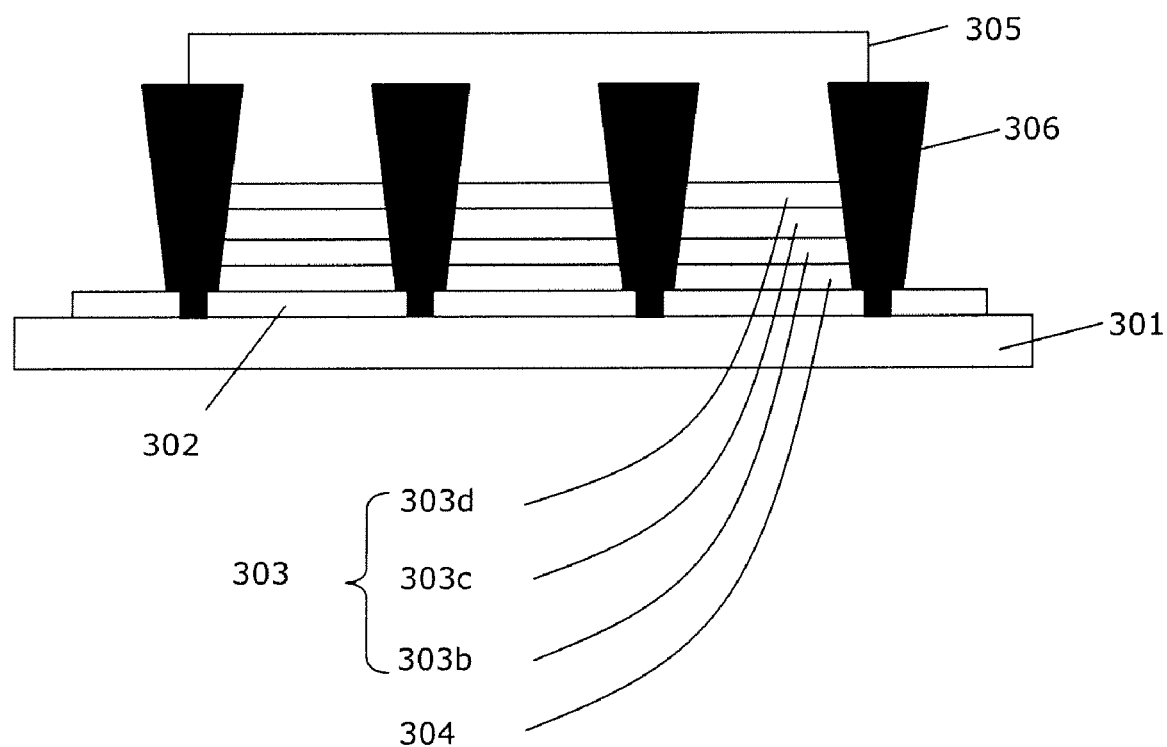
FIG. 10 is an explanatory diagram showing an example of a display unit of the present invention.

Next, FIG. 10 shows an example of a passive matrix type display unit using an organic electroluminescence element. FIG. 10 is a cross-sectional schematic view.

When a substrate 301 side is the display side, after a line-shaped transparent or semitransparent first electrode 302 is formed on the substrate 301 as an anode, insulating layer 306 can be formed between adjacent electrodes if necessary. For example, insulating layer 306 can be formed by a well-known method such as photo-lithography methods using a photosensitive material.

Spreading of ink comprising material of a luminescent medium layer which is coated on each electrode can be controlled by arranging insulating layers 306 between adjacent electrodes.

In particular, it is possible to prevent a mixture of colors in the case where a luminescent medium layer is formed of multiple colors.

For a photosensitive material forming insulating layer 306, positive type resist or negative type resist can be used. For example, for material having insulating properties, materials such as polyimide, acryl resin or novolac resin can be used.

In addition, a photosensitive material may contain a material of light shielding properties to improve the display characteristics of an organic electroluminescent element. Furthermore, a photosensitive material may contain a liquid-repellent material to prevent ink spreading to an insulating layer.

A light-sensitive resin forming insulating layer 306 can be applied by an application method using a spin coater, bar coater, roll coater, die coater or gravure coater. An applied light-sensitive resin can be patterned by a photo-lithography method.

When a spin coater is used, a film of a desired thickness may not be obtained by a single application of ink. In this case, by repeating a similar process multiple times, a film of a desired thickness can be obtained.

The surface of insulating layer 306 can be made liquid repellent by performing processing such as plasma cleaning or UV-ozone treatment on obtained insulating layer 306 if necessary.

And for example, a molybdenum oxide layer 304 is layered in a vacuum condition and an electron blocking layer 303b and an organic luminescent layer 303c are layered by letterpress printing in air after depositing insulating layer 306. Electron injection layer 303d is then layered in a vacuum condition.

FIG. 10 shows a pattern in which a molybdenum oxide layer is arranged between partition walls. However, if the electric properties of a molybdenum oxide layer are sufficiently controlled, a molybdenum oxide layer can be formed to cover between the partition walls and all of partition walls.

In the case where the molybdenum oxide layer 304 is arranged between partition walls, charge leak between molybdenum oxide layers 304 can be reliably prevented. On the another hand, in the case where the molybdenum oxide layer 304 is formed between partition walls and covering all of the partition walls, the efficiency of the manufacturing process increases because the use of a mask and photolithography process or the like can be omitted.

As shown in FIG. 10, organic luminescent medium layer 303 includes electron blocking layer 303b, organic luminescent layer 303c and electron injection layer 303d. However, the layer structure can be selected arbitrarily.

And in FIG. 10, the molybdenum oxide layer 304 is arranged as a hole injection layer but may be installed as an arbitrary layer. Moreover, a plurality of molybdenum oxide layers can be arranged as a plurality of different functional layers.

Moreover, in FIG. 10, an electron blocking layer 303b and an organic luminescent layer 303c are formed in air. However, formation of a luminescent medium layer in a vacuum condition and formation of a luminescent medium layer in air can be preferably combined. For example, after a hole injection layer 303a, an electron blocking layer 303b and an organic luminescent medium layer 303d are formed by a letterpress printing method in air, the molybdenum oxide layer 304 is formed in a vacuum condition.

And, the line-shaped second electrode 305 can be preferably formed as a cathode so that it is perpendicular to the first electrode 302.

In FIG. 10, layers are formed on substrate 301 from an anode electrode, however, the layers can be arbitrarily formed from a cathode electrode.

In addition, in FIG. 10, substrate 301 side is a display side, however, the opposite side of the substrate 301 side can arbitrarily be a display side.

Moreover, FIG. 10 shows an example of a passive matrix type display unit using a line electrode. However, well-known drive systems such as segment type using an arbitral pattern electrode and active matrix type using a pixel electrode or thin-film transistor can be preferably selected.

And if necessary, an organic electroluminescent element is sealed using a glass cap and adhesive to protect the organic electroluminescent element from external oxygen and moisture. A display unit can be obtained in this way. In addition, in the case of an organic electroluminescent element having a flexible substrate, the organic electroluminescent element may be sealed using a sealing compound and a flexible film. A display unit can be obtained in this way also.

According to the present invention, by including a molybdenum oxide layer having at least molybdic anhydride and one or more other inorganic compounds, an organic electroluminescent element and display unit of high luminous efficiency, high emission brightness and long life time without defects can be provided.

In addition, the organic electroluminescent element is protected from the effects of deteriorating factors in every process by including a process of forming a film of molybdic anhydride and one or more other inorganic compounds at the same time. Thus, a quick, efficient, inexpensive and stable manufacturing method of an organic electroluminescent element of high luminous efficiency, high emission brightness and long life, without defects could be provided.

In addition, the organic electroluminescent element is protected from the effects of deteriorating factors in every process by including a process of forming a film of a first material including molybdic anhydride and a second material including one or more other inorganic compounds in tandem. Thus, a quick, efficient, inexpensive and stable manufacturing method of an organic electroluminescent element of high luminous efficiency, high emission brightness and long life without defects could be provided.

In addition, the organic electroluminescent element is protected from the effects of deteriorating factors in every step by including a process of etching a surface of a film to be formed after a process of depositing molybdic anhydride. Thus, a quick, efficient, inexpensive and stable manufacturing method of an organic electroluminescent element of high luminous efficiency, high emission brightness and long life without defects could be provided.

EXAMPLE

Example 1

First, a glass substrate with a thickness of 0.7 mm and opposing corner of 108 inches was used as a substrate. On this substrate, ITO which was an anodic material was used and an ITO layer was formed by sputtering in a vacuum condition. A line electrode was provided by patterning the ITO layer by etching with photolithography method and acid solution. 192 line patterns with line width of 136 μm, and space of 30 μm were formed.

Next, as an insulating layer material, an acrylic photoresist material was spin coated over the entire surface of the glass substrate on which the line electrode is formed. After spinning for 5 seconds under spin coat conditions of 150 rpm, spinning of 500 rpm for 20 seconds was performed and a coated film with a height of 1.5 μm was provided in this way. After that, a line-shaped insulating layer was formed by a photolithography method between electrodes.

Next, a molybdenum oxide layer with a thickness of 100 nm was provided by depositing molybdenum dioxide and molybdic anhydride together in a vacuum condition as a hole injection layer and/or a hole transport layer. At this time, the proportion of molybdenum dioxide to molybdic anhydride was 5%.

Next, an organic luminescent layer was formed on a hole transport layer by a letterpress printing method in air by using an ink including a weight concentration of PPV derivative which was an organic luminescent material of 1% and each weight concentration of xylene and anisole was 84% and 15%. At this time, an organic luminescent layer with a thickness of 80 nm was formed after an organic luminescent layer was dried, using an anilox roll of 130 line/inch and a water-developable type photopolymer plate.

Next, an electron injection layer with a line pattern thickness of 5 nm was formed using Ba which is an electron injection material by a vacuum deposition using a mask.

Lastly, using Al which is a cathode material, an electrode with a line pattern thickness of 150 nm was formed using a mask and a vacuum deposition so that the electrode was perpendicular to the anode formed by ITO. 192 line patterns with line width of 136 μm and space of 30 μm were formed. A glass cap and an adhesive were used, and the organic electroluminescent assembly was sealed. In this way a passive matrix type organic electroluminescent element and a display unit were obtained.

When the emission characteristics of the passive matrix type organic electroluminescent element display unit which was obtained by the present example was evaluated, a short-circuit between electrodes was not recognized and it was possible to light only selected picture elements and uniform luminescence without irregularity could be provided. At the same time, superior display characteristics of high luminous efficiency, high emission brightness and long life time could be provided and brightness half-life time was 170 hours, when initial brightness was 1800 cd/m$^2$. And brightness was 2600 cd/m$^2$ at 6V.

And as a result of performing an acceleration at a constant temperature and high humidity environment of 60° C. and 90% respectively, dark spots on a light-emitting face were not recognized up to 3000 hours.

After depositing a molybdenum oxide layer, a transmittance measurement was performed with a wavelength of visible area from 380 nm~800 nm, using a part where only a molybdenum oxide layer is formed on a glass substrate and the transmittance was equal to or more than 80% in the visible light area from 380 nm~800 nm.

Example 2

The structure of the molybdenum oxide layer in EXAMPLE 1 included a molybdenum dioxide layer and a molybdic anhydride layer and a passive matrix organic electroluminescence element display unit was manufactured. The molybdic anhydride layer was manufactured by depositing a molybdic anhydride layer with a thickness of 100 nm by a vacuum deposition. Next, 2 nm of molybdenum dioxide was deposited as a molybdenum dioxide layer by the same method and a passive matrix type organic electroluminescence element was provided.

When the emission characteristics of the obtained display unit was evaluated, a short-circuit between electrodes was not recognized, it was possible to light only the selected picture elements and uniform luminescence without irregularity could be provided. At the same time, superior display characteristics of high luminous efficiency, high emission brightness and long life time could be provided. And brightness half-life time was 170 hours, when initial brightness was 1800 cd/m$^2$. And brightness was 2600 cd/m$^2$ at 6V.

And as a result of performing an acceleration test at a constant temperature and high humidity environment of 60° C. and 90% respectively, dark spots on a light-emitting face was not recognized up to 3000 hours.

After depositing a molybdenum oxide layer, a transmittance measurement was performed using a part where only a molybdenum oxide layer is formed on a glass substrate. Then, transmittance was equal to or more than 80% in the visible light area from 380 nm~800 nm.

Example 3

The structure of the molybdenum oxide layer in EXAMPLE 2 included a 2 nm molybdenum dioxide layer sandwiching a 100 nm molybdic anhydride layer and a passive matrix type organic electroluminescence element display unit was manufactured.

When the emission characteristics of a provided display unit was evaluated, a short-circuit between electrodes was not recognized, it was possible to light only the selected picture elements and uniform luminescence without irregularity could be provided. At the same time, superior display characteristics of high luminous efficiency, high emission brightness and long life time could be provided. And brightness half-life time was 230 hours, when initial brightness was 1800 cd/m². And brightness was 2500 cd/m² at 6V.

And as a result of performing an acceleration test at a constant temperature and high humidity environment of 60° C. and 90% respectively, dark spots on a light-emitting face were not recognized up to 4000 hours.

After depositing a molybdenum oxide layer, a transmittance measurement was performed using a part where only a molybdenum oxide layer is formed on a glass substrate. Then, transmittance was equal to or more than 77% in the visible light area from 380 nm~800 nm.

Example 4

The thickness of the molybdenum dioxide layer in EXAMPLE 2 was 50 nm and a passive matrix type organic electroluminescence element display unit was manufactured.

When the emission characteristics of a provided display unit was evaluated, a short-circuit between electrodes was not recognized, it was possible to light only the selected picture elements and uniform luminescence without irregularity could be provided. At the same time, superior display characteristics of high luminous efficiency, high emission brightness and long life time could be provided. And brightness half-life time was 180 hours, when initial brightness was 1800 cd/m². And brightness was 1800 cd/m² at 6V.

And as a result of performing an acceleration at a constant temperature and high humidity environment of 60° C. and 90% respectively, dark spots on a light-emitting face were not recognized up to 3500 hours.

After layering a molybdenum oxide layer, a transmittance measurement was performed using a part where only a molybdenum oxide layer is formed on a glass substrate. Then, transmittance was equal to or more than 60% in the visible light area from 380 nm~800 nm.

Example 5

The thickness of the molybdenum dioxide layer sandwiching a molybdic anhydride layer in EXAMPLE 3 was 50 nm and a passive matrix type organic electroluminescence element display unit was manufactured.

When the emission characteristics of a provided display unit was evaluated, a short-circuit between electrodes was not recognized, it was possible to light only the selected picture elements and uniform luminescence without irregularity could be provided. At the same time, superior display characteristics of high luminous efficiency, high emission brightness and long life time could be provided. And brightness half-life time was 200 hours, when initial brightness was 1800 cd/m². And brightness was 1600 cd/m² at 6V.

And as a result of performing an acceleration at a constant temperature and high humidity environment of 60° C. and 90% respectively, dark spots on a light-emitting face were not recognized up to 4500 hours.

After layering a molybdenum oxide layer, a transmittance measurement was performed using a part where only a molybdenum oxide layer is formed on a glass substrate. Then transmittance was equal to or more than 55% in the visible light area from 380 nm~800 nm.

Example 6

The thickness of the molybdenum dioxide layer in EXAMPLE 2 was 10 nm and a passive matrix type organic electroluminescence element display unit was manufactured.

When the emission characteristics of a provided display unit was evaluated, a short-circuit between electrodes was not recognized, it was possible to light only the selected picture elements and uniform luminescence without surface irregularity could be provided. At the same time, superior display characteristics of high luminous efficiency, high emission brightness and long life time could be provided. And brightness half-life time was 230 hours, when initial brightness was 1800 cd/m². And brightness was 2400 cd/m² at 6V.

And as a result of performing an acceleration test at a constant temperature and high humidity environment of 60° C. and 90% respectively, dark spots on a light-emitting face were not recognized up to 3800 hours.

After layering a molybdenum oxide layer, a transmittance measurement was performed using a part where only a molybdenum oxide layer is formed on a glass substrate. Then transmittance was equal to or more than 75% in the visible light area from 380 nm~800 nm.

Example 7

The thickness of the molybdenum dioxide layer sandwiching molybdic anhydride layer in EXAMPLE 3 was 10 nm and a passive matrix type organic electroluminescence element display unit was manufactured.

When the emission characteristics of a provided display unit was evaluated, a short-circuit between electrodes was not recognized. It was possible to light only the selected picture elements and uniform luminescence without surface irregularity could be provided. At the same time, superior display characteristics of high luminous efficiency, high emission brightness and long life time could be provided. And brightness half-life time was 280 hours, when brightness was 6V and 2200 cd and that initial brightness was 1800 cd/m².

And as a result of performing an acceleration test at constant temperature and high humidity environment of 60° C. and 90% respectively, dark spots on a light-emitting face were not recognized up to 4500 hours.

After layering a molybdenum oxide layer, a transmittance measurement was performed using a part where only a molybdenum oxide layer is formed on a glass substrate. Then, transmittance was equal to or more than 77% in the visible light area from 380 nm~800 nm.

Example 8

The molybdenum oxide layer in EXAMPLE 1 with a thickness of 40 nm was formed by depositing titanic oxide and molybdic anhydride together in a vacuum condition and a passive matrix type organic electroluminescence element display unit was manufactured.

When the emission characteristics of the passive matrix type organic electroluminescent element display unit which was provided by the present example, was evaluated, a short-circuit between electrodes was not recognized, it was possible to light only the selected picture elements and uniform luminescence without surface irregularity could be provided. At the same time, superior display characteristics of high luminous efficiency, high emission brightness and long life time could be provided. And brightness half-life time was 300 hours, when initial brightness was 1800 cd/m$^2$. And brightness was 2600 cd/m$^2$ at 6V.

And as a result of performing an acceleration test at constant temperature and high humidity environment of 60° C. and 90% respectively, although light-emitting was confirmed up to an upper limit of 5500 hours, dark spots on a light-emitting face were not recognized.

After layering a molybdenum oxide layer, a transmittance measurement was performed with wavelength of visible area from 380 nm~800 nm using a part where only a molybdenum oxide layer is formed on a glass substrate. Then, transmittance was equal to or more than 80% in the visible light area from 380 nm~800 nm.

Example 9

The molybdenum oxide layer in EXAMPLE 1 with a thickness of 20 nm was formed by depositing nickel oxide and molybdic anhydride together in a vacuum condition and a passive matrix type organic electroluminescence element display unit was manufactured.

When the emission characteristics of the passive matrix type organic electroluminescent element display unit which was provided by the present example, was evaluated, a short-circuit between electrodes was not recognized, it was possible to light only the selected picture elements and uniform luminescence without irregularity could be provided. At the same time, superior display characteristics of high luminous efficiency, high emission brightness and long life time could be provided. And brightness half-life time was 350 hours, when initial brightness was 1800 cd/m$^2$. And brightness was 2600 cd/m$^2$ at 6V.

And as a result of performing an acceleration test at constant temperature and high humidity environment of 60° C. and 90% respectively, although light-emitting was confirmed up to an upper limit of 5500, dark spots on a light-emitting face were not recognized.

After layering a molybdenum oxide layer, a transmittance measurement was performed with wavelength of visible area from 380 nm~800 nm using a part where only a molybdenum oxide layer is formed on a glass basal substrate. Then, transmittance was equal to or more than 75% in the visible light area from 380 nm~800 nm.

Comparative Example 1

The molybdenum oxide layer in example 1 was not arranged and only a molybdic anhydride layer was vacuum evaporated as a hole transport layer and a passive matrix type organic electroluminescence element display unit was manufactured.

When the provided display unit was evaluated, a short-circuit between electrodes was not recognized and it was possible to light only the selected picture elements. However, there was partial irregularity in light-emitting and brightness half-life time was 150 hours, when initial brightness was 1800 cd/m$^2$. And brightness was 1500 cd/m$^2$ at 6V.

And as a result of performing an acceleration test at constant temperature and high humidity environment of 60° C. and 90% respectively, dark spots on a light-emitting face were recognized in 1500 hours. Compared with example 1 in which a molybdenum oxide layer was arranged, the display characteristics of low luminous efficiency, low emission brightness, short life time and low humidity resistance was provided.

After depositing a molybdic anhydride layer, a transmittance measurement was performed using a part where only a molybdic anhydride layer is formed on a glass substrate. Then, transmittance was equal to or more than 80% in the visible light area from 380 nm~800 nm.

What is claimed is:

1. An organic electroluminescence element comprising:
   a substrate;
   a first electrode arranged on said substrate;
   a luminescent medium layer including at least an organic luminescent layer and a hole injection layer arranged on said first electrode, said hole injection layer consisting of molybdic anhydride and other inorganic compounds; and
   a second electrode facing said first electrode, said first electrode and said second electrode sandwiching said luminescent medium layer,
   wherein said hole injection layer is formed by stacking a layer consisting of molybdic anhydride and a layer consisting of one or more of the other inorganic compounds.

2. The organic electroluminescence element according to claim 1,
   wherein said one or more other inorganic compounds are any of molybdenum dioxide, indium oxide, titanic oxide, iridium oxide, tantalum oxide, nickel oxide, tungsten oxide, vanadium oxide, tin oxide, lead oxide, niobium oxide, aluminum oxide, copper oxide, manganese oxide, praseodymium oxide, chrome oxide, bismuth oxide, calcium oxide, barium oxide, cesium oxide, lithium fluoride, sodium fluoride, zinc selenide, zinc telluride, gallium nitride, gallium indium nitride, magnesium silver, aluminum lithium and copper lithium.

3. The organic electroluminescence element according to claim 1,
   wherein a thickness of said layer consisting of molybdic anhydride is equal to or more than 5 nm and equal to or less than 100 nm, and
   wherein a thickness of said layer consisting of one or more of the other inorganic compounds is equal to or more than 5nm and equal to or less than 30nm.

4. The organic electroluminescence element according to claim 3,
   wherein the one or more other inorganic compounds is molybdenum dioxide, nickel oxide, or titanic oxide.

5. A manufacturing method of an organic electroluminescence element according to claim 1,
   the method comprising:
   forming said hole injection layer only from molybdic anhydride and one or more of the other inorganic compounds,
   wherein forming said hole injection layer includes forming in tandem a first material consisting of said molybdic anhydride and a second material consisting of said one or more other inorganic compounds.

6. The manufacturing method of an organic electroluminescence element according to claim 5,
   wherein a thickness of an inorganic compound layer formed during said process for forming said first material consisting of molybdic anhydride is equal to or more than 5 nm and equal to or less than 100 nm, and
   a thickness of an inorganic compound layer formed during said process for forming said second material including said one or more other inorganic compounds is equal to or more than 5 nm and equal to or less than 30nm.

* * * * *